(12) United States Patent
Fiedler

(10) Patent No.: US 12,451,877 B2
(45) Date of Patent: Oct. 21, 2025

(54) APPARATUS COMPRISING A COMPARATOR CIRCUIT

(71) Applicant: Fraunhofer-Gesellschaft zur Förderung der angewandten Forschung e.V., Munich (DE)

(72) Inventor: Raik Fiedler, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 18/508,341

(22) Filed: Nov. 14, 2023

(65) Prior Publication Data

US 2024/0088881 A1 Mar. 14, 2024

Related U.S. Application Data

(63) Continuation of application No. PCT/EP2021/063562, filed on May 20, 2021.

(51) Int. Cl.
*H03K 5/24* (2006.01)
*H03K 5/135* (2006.01)
*H03K 19/21* (2006.01)

(52) U.S. Cl.
CPC ............ *H03K 5/249* (2013.01); *H03K 5/2481* (2013.01); *H03K 19/215* (2013.01); *H03K 5/135* (2013.01)

(58) Field of Classification Search
CPC ........ H03K 5/2481; H03K 5/249; H03K 5/24; H03K 19/20; H03K 3/037;
(Continued)

(56) References Cited

U.S. PATENT DOCUMENTS

| 5,515,024 A | 5/1996 | Ghia et al. |
| 8,233,331 B2 | 7/2012 | Chan et al. |

(Continued)

FOREIGN PATENT DOCUMENTS

| CN | 104935344 A | 9/2015 |
| CN | 107832550 A | 3/2018 |

(Continued)

OTHER PUBLICATIONS

International Search Report and Written Opinion issued in application No. PCT/EP2021/063562.
(Continued)

*Primary Examiner* — Lincoln D Donovan
*Assistant Examiner* — Tyler J Pereny
(74) *Attorney, Agent, or Firm* — McClure, Qualey & Rodack, LLP

(57) ABSTRACT

An apparatus includes a comparator circuit and a clock generation circuit. The comparator circuit is configured to compare a first input signal with a second input signal during a first comparison phase to obtain a comparison result. Furthermore, an output signal is output, wherein a waveform of the output signal indicates the comparison result. During a subsequent regeneration phase, at least a part of the comparator circuit is reset for a subsequent second comparison phase. The comparator circuit is configured to receive a clock signal, and to change from the first comparison phase to the regeneration phase based on the clock signal. The clock generation circuit is configured to receive the output signal or a signal derived therefrom, and to generate the clock signal based on the waveform of the output signal to control the comparator circuit from the comparison phase to the regeneration phase based on the signal waveform.

11 Claims, 15 Drawing Sheets

(58) Field of Classification Search
CPC ....... H03K 3/356121; H03K 3/356139; H03K 3/356156; H03K 3/356191; H03M 1/46; H03M 1/125; H03M 1/466; H03M 1/362; H03M 1/462; H03F 1/301; H03F 2200/129; H03F 2200/447; H03F 2203/45112; H03F 2203/45461; H03F 2203/45504; H03F 3/04; H03F 3/45183
See application file for complete search history.

(56) References Cited

U.S. PATENT DOCUMENTS

| | | | |
|---|---|---|---|
| 11,909,401 B2* | 2/2024 | Dey | H03K 5/2427 |
| 2015/0187335 A1 | 7/2015 | Sugiyama et al. | |
| 2019/0081635 A1* | 3/2019 | Kurahashi | H03M 1/468 |

FOREIGN PATENT DOCUMENTS

| | | |
|---|---|---|
| CN | 110391796 A | 10/2019 |
| WO | 2021/072251 A1 | 4/2021 |

OTHER PUBLICATIONS

Ergin, O.B., et al.; "Investigation of Comparator Topologies and their Usage in a Technology Independent Flash-ADC Testbed;" pp. 1-31.

Huang, S., et al.; "An energy-efficient high-speed CMOS hybrid comparator with reduced delay time in 40-nm CMOS process;" Analog Integr Circ Sig Process; May 2016; pp. 231-238.

Huang, Y.; "A Tracking ADC with Transient-Driven Self-Clocking for Digital DC-DC Converters;" dissertation; 2013.

Zhang, M., et al.; "An energy-efficient Sar Adc using a single-phase clocked dynamic comparator with energy and speed enhanced technique;" IEICE Electronics Express; vol. 14; No. 8; 2017; pp. 1-9.

* cited by examiner

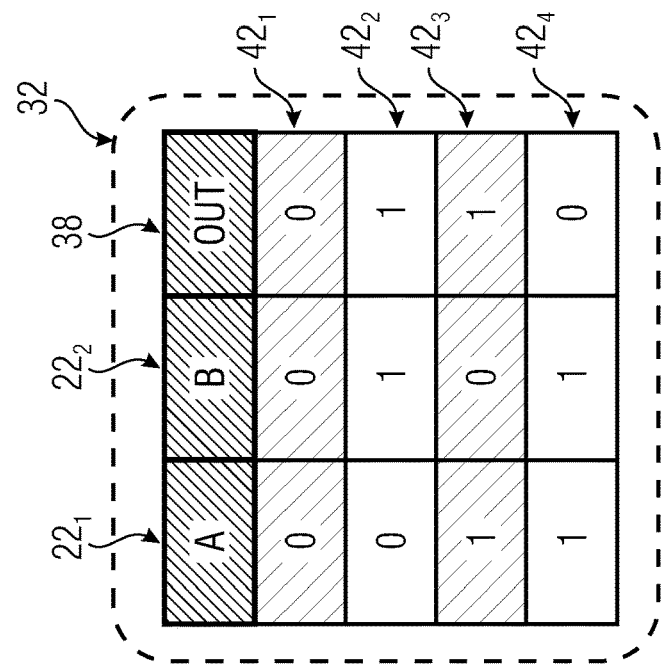
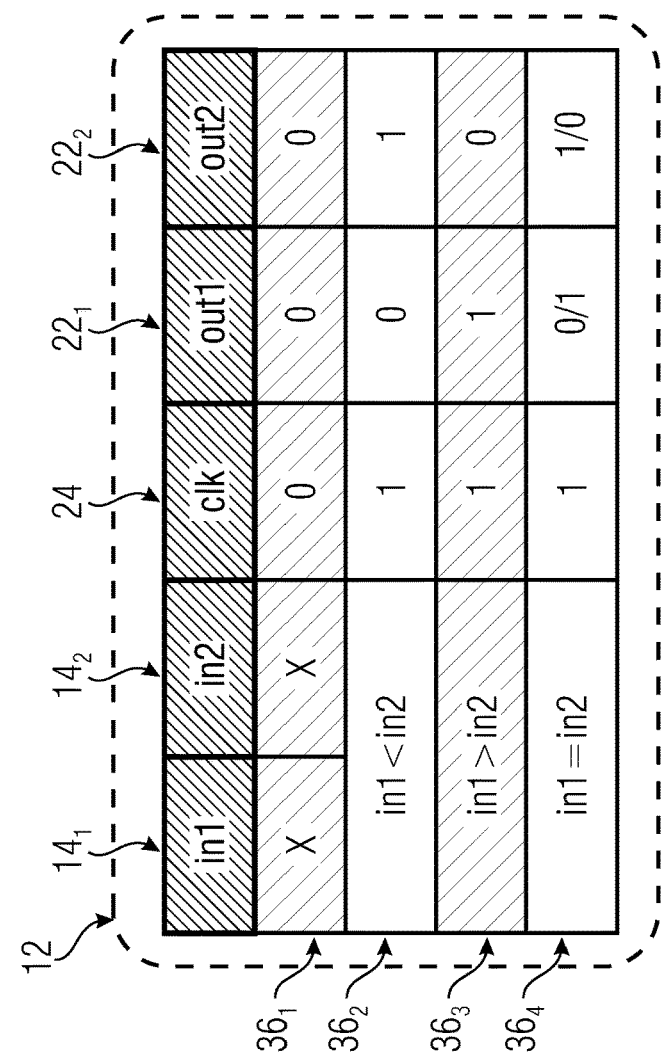
Fig. 2b
Fig. 2a

APPARATUS COMPRISING A COMPARATOR CIRCUIT

CROSS-REFERENCE TO RELATED APPLICATIONS

This application is a continuation of copending International Application No. PCT/EP2021/063562, filed May 20, 2021.

The present invention relates to an apparatus comprising a comparator circuit and a clock generation circuit for generating a clock signal for the comparator circuit from an output signal of the comparator circuit. In particular, the present invention relates to a self-clocked dynamic comparator. The present invention further relates to a circuit and a principle of an energy-efficient discrete-time comparator with inherent self-clocking, without the need for an internal or external oscillator to switch between the active comparison phase and the passive regeneration phase.

BACKGROUND OF THE INVENTION

Clocked or dynamic comparators have a high sensitivity and response speed in distinguishing input-side differences and can realize this function with very few, small transistors and thus on a very small area while consuming very little power. Due to these properties, dynamic comparators are mainly used in analog-to-digital converters and are thus part of a wide range of applications [1].

However, this comparator topology needs an internal or external clock to switch between the passive regeneration phase and the active comparison phase. Two main problems arise here.

On the one hand, the clock must be fast enough to follow the change rate of the input signals. It should be noted that the sensitivity of the comparator also depends strongly on the absolute difference of the input signals. The comparator can react faster to large differences than to very small ones. Thus, if the clock frequency is chosen too high, the comparator would not be able to change its output in time before falling back into the passive regeneration phase, and the output signal would possibly be unusable or faulty for the subsequent system blocks. The same applies to the selection of a clock rate that is too slow, but this should be avoided in the system design and does not represent a fundamental limitation of the comparator.

On the other hand, there are asynchronous systems, especially in the field of sensor technology, with extremely low power budgets, where the clock generation would have to be additionally realized internally or externally and the complexity and power consumption, depending on the target frequency, of the overall system would increase significantly as a result.

To prevent these disadvantages and at the same time ensure high sensitivity, with small area and low power consumption, independent and dynamic clock generation by the comparator would be needed. The concept presented in this invention disclosure can meet these criteria.

A comparator compares two input-side voltages or currents and indicates with its output signal which of the two signals is higher or, conversely, which of the two signals is lower. Since this output signal can only assume two states (high or low), it is also referred to as a 1-bit analog-to-digital converter.

In comparison, a differential amplifier, as the basis of operational amplifiers, provides a simple or amplified difference of the two input signals and thus an analog output signal. The comparator can thus be regarded as a special case of a differential amplifier, in which the internal amplification of the difference on the input side is so great that the output signal strikes the respective supply rails and can only assume two states.

A further distinction is made between time-continuous/static and time-discrete/clocked comparators. An example of a static comparator is shown in FIG. 7. This is a classic differential pair with active load (PMOS current mirror). The dimensioning of the input transistors M1a/M1b and the load transistors (M2a/M2b) must be implemented for a corresponding amplification of the input-side difference. The comparator is in an active state and can therefore compare the two input signals at any time. However, this is also accompanied by a continuous current consumption depending on the impedance between VDD and VSS.

In other words, FIG. 7 shows a classic differential pair with active load according to [2].

One way of making the internal amplification as large as possible is to use cross-coupled PMOS or NMOS pairs or both in combination as a so-called "latch". Such a statically latched comparator is shown in FIG. 8.

The differential pair M1a/M1b on the input side acts as a preamplifier and the cross-coupled NMOS transistors M5a/M5b act as decision makers. As a result, the output signals Von and Vop will assume opposite potentials. Due to the positive feedback between M5a and M5b, the internal gain is so large that small input-side differences are not sufficient to change the output potentials. Therefore, the "latch" must be reset before a new comparison operation. In the present circuit, this is done by transistors M4a and M4b. In other words, FIG. 8 shows a statically latched comparator according to [2].

Since in the application a comparator usually has to perform several comparison operations in succession, the introduction of a periodic clock for resetting the "latch" seems to be obvious. An example of such a discrete-time/clocked or dynamic comparator can be seen in FIG. 9.

In other words, FIG. 9 shows an example of a known dynamic comparator according to [2].

The "latch" consists of the cross-coupled transistors M3-M6 and via a clock signal CLK the comparator is set either to the passive regeneration phase (Von=Vop=VDD) or the active comparison phase (Von=0/1 and Vop=1/0). Based on this principle, there is again the possibility to use a preamplifier and thus several stages. FIG. 10 shows an exemplary realization, the basic mode of operation of the dynamic comparator remains unchanged.

Compared to static comparators, clocked comparators can therefore only perform a comparative operation in half the period of the applied clock. On the other hand, this topology boasts minimal static power consumption (leakage currents), since the voltage potentials are only recharged during the switching moment of the clock period. In other words, FIG. 10 shows a dynamic 2-stage comparator according to [2].

Accordingly, it would be desirable to provide comparator circuits that allow clock adjustment that is both simple and not susceptible to errors.

SUMMARY

According to an embodiment, an apparatus may have: a comparator circuit configured to compare a first input signal with a second input signal during a first comparison phase to obtain a comparison result; and to output an output signal, a waveform of the output signal being indicative of the comparison result; and to reset, during a subsequent regeneration phase, at least a portion of the comparator circuit for a subsequent second comparison phase; wherein the comparator circuit is configured to receive a clock signal and to change from the first comparison phase to the regeneration phase based on the clock signal; and a clock generation circuit configured to receive the output signal or a signal derived therefrom and to generate the clock signal based on the waveform of the output signal; to control the comparator circuit from the comparison phase to the regeneration phase depending on the waveform.

A core idea of the present invention is having recognized that a regeneration of the comparator circuit following a performed comparison and depending on the comparison results in the regeneration being more dependent on the comparison than on an external clock signal. Such a feedback can be accomplished by simple means and, moreover, allows a clock adjustment depending on the speed of the comparison, which avoids both too fast and too slow clock rates and, thus, is not susceptible to errors.

According to an embodiment, an apparatus comprises a comparator circuit configured to compare a first input signal with a second input signal during a first comparison phase to obtain a comparison result. The comparator circuit is configured to output an output signal, wherein a waveform of the output signal indicates the comparison result. The comparator circuit is configured to reset, during a regeneration phase following the comparison phase, at least a part of the comparator circuit for a subsequent second comparison phase. This is done based on a received clock signal. Based on the clock signal, the comparator circuit changes from the first comparison phase to the regeneration phase. The apparatus further comprises a clock generation circuit configured to receive the output signal or a signal derived therefrom, and to generate the clock signal based on the waveform of the output signal to control the comparator circuit from the comparison phase to the regeneration phase based on the waveform. This makes it possible to obtain the clock signal in such a way that the presence of the comparison result, recognizable in the output signal, results in subsequently triggering the regeneration phase, which is possible by simple means and results in control of the comparator circuit, which is not susceptible to errors.

According to an embodiment, the comparator circuit is configured to provide the output signal as a first partial signal and a second partial signal, for example as a differential comparator. The comparator circuit is configured to indicate the comparison result starting from a reference state obtained by a preceding regeneration phase by means of a level change in exclusively one of the first partial signal and the second partial signal. This allows a signal-specific consideration of the information, which allows a low degree of complexity.

According to an embodiment, the apparatus is configured to generate the clock signal automatically and in dependence of the first input signal and the second input signal. From this, the apparatus can generate the clock signal itself, wherein the dependence on the input signals makes it possible to avoid both a clock that is too fast and a clock that is too slow without being susceptible to errors.

According to an embodiment, the clock generation circuit is configured to generate, triggered by a level change of the output signal indicating that the comparison phase is completed and the comparison result is available, a level change in the clock signal, which triggers a change from the first comparison phase to the regeneration phase. Such a dependency can be implemented in a wide variety of ways without generating susceptibility to errors.

According to an embodiment, an apparatus is configured such that upon completion of the regeneration phase, a further level change is caused in the clock signal, which in turn triggers the second comparison phase. In this way, a kind of back-and-forth control of the clock signal can be obtained, in which one state of the comparator circuit influences the clock signal and the clock signal in turn controls the subsequent state of the comparator circuit.

According to an embodiment, a time duration of the comparison phase is dependent on the first input signal and the second input signal. The apparatus is configured to generate a clock rate of the clock signal depending on the time duration of the comparison phase. For example, rapid level changes in the input signals may produce a rapid comparison result and thus a short time duration of the comparison phase. The embodiment thus allows the clock rate to be increased compared to slower change rates in the input signals, and thus allows automatic clock adjustment, which is advantageous in terms of acquiring the sampled signals at the highest possible resolution.

According to an embodiment, the clock generation circuit is configured such that there are a first circuit portion and at least a second circuit portion. The first circuit portion is configured to output, at a first circuit portion output, a first intermediate signal indicating whether or not a comparison result is present. The second circuit portion is configured to derive the clock signal from the first intermediate signal. This allows conditioning the change to the regeneration phase on whether or not the comparison result is already present.

According to an embodiment, the first circuit portion is formed as an XOR gate (i.e. exclusive OR) and its inputs form a first partial signal and a second partial signal, wherein the comparator circuit indicates the presence of the comparison result in exclusively one of the two partial signals. This can be logically understood to mean that in the event that one of the two signals indicates that a result "greater than the other signal" is present, the comparison result is present no matter in which of the two partial signals the corresponding result is indicated. This accumulated information, which is possible due to the XOR gate, can be used as the basis for the clock signal.

Processing this corresponding signal obtained by such an XOR component is the subject of further embodiments.

On the one hand, these relate to the fact that a signal source is provided which is configured to provide a control signal with a first control signal level for the duration of a measurement interval for carrying out at least the first comparison phase. According to the embodiment, a second XOR gate is part of the apparatus and is connected on the input side to the signal source and to the first circuit portion. The second XOR gate is configured to provide the clock signal based on a combination of the control signal and the first control signal. This makes it possible to control the measurement interval by the signal source and thus to avoid energy consumption, for measurements for which no result is needed.

In the context of this embodiment, the signal source may be configured to provide the control signal with a first signal level, during the measurement interval, that logically corresponds to a result signal level of the first intermediate signal. The first result signal level may indicate that the comparison result is present. A regeneration level of the first intermediate signal, on the other hand, indicates that the regeneration phase has been executed and thus the comparator circuit is ready for a new measurement. This level is different from the result signal level. The signal source is synchronized with the first circuit portion and arranged to change the control signal to a second control signal level different from the first control signal level to terminate the measurement interval, the second control signal level having a logic state corresponding to a logic state of the regeneration level. Such a synchronization can be used to prevent a new measurement from being started, thus ending the measurement interval. At the same time, it is ensured that the comparator is regenerated and ready for measurement at the start of a subsequent measurement interval.

The signal source is configured to change the control signal, in order to end the measurement interval, to the second control signal level exclusively at times when the first intermediate signal has the regeneration level.

According to another embodiment, the signal source is not necessarily synchronized. For example, the signal source may be configured to provide a control signal having a first control signal level for the duration of a measurement interval for performing at least the first comparison phase. In addition to the signal source, the second circuit portion includes a second XOR gate and a third XOR gate, wherein an output signal of the third XOR gate is coupled to a first input of the second XOR gate. A second input of the second XOR gate is coupled to the first circuit portion output to receive the first intermediate signal. The third XOR gate is configured to provide a second intermediate signal at a signal output. The second XOR gate is configured to provide the clock signal at an output of the second XOR gate based on a combination of the first intermediate signal and the second intermediate signal. This output is coupled to the comparator circuit on the one hand and to the first input of the third XOR gate on the other hand. Hereby it can be achieved that the signal source, despite its asynchrony, is subsequently synchronized by the described third XOR gate delaying corresponding level changes and ensuring that a regeneration phase is still executed after a measurement interval.

In the context of this embodiment, it is possible to implement the signal source such that it is configured to provide the control signal during the measurement interval with a first signal level that logically corresponds to a result signal level of the second intermediate signal indicating that the comparison result is present. A regeneration level of the first intermediate signal indicates that the regeneration phase is executed and is different from the result signal level. The signal source is configured to initiate termination of the measurement interval by changing the control signal to a second control signal level. The apparatus is configured to change the second intermediate signal to a state logically corresponding to the regeneration level by coupling it to the output of the second XOR gate by means of the third XOR gate when changing the control signal to the second control signal level only at times when the first intermediate signal has the regeneration level. This also prevents a new measurement from being started and at the same time ensures that the comparator is regenerated. An additional XOR gate is used for this compared to the first embodiment, but the synchronization of the signal source can be dispensed with.

Both embodiments may be implemented such that the apparatus is configured to terminate the measurement interval exclusively at a time when the first intermediate signal has a regeneration level indicating that the comparator circuit is regenerated for a subsequent comparison phase.

Another possibility is defined in embodiments in that the second circuit portion comprises a continuous signal source configured to provide a constant control signal, i.e., a signal having a constant amplitude. Further, the second circuit portion comprises control means configured to supply the continuous signal source and the comparator circuit with an energy for operating the continuous signal source and the comparator circuit for the duration of a measurement interval for performing at least the first comparison phase. The second circuit portion further comprises a second XOR gate coupled on the input side to the continuous signal source and to the first circuit portion, and configured to provide the clock signal based on a combination of the constant control signal and the second intermediate signal. This allows the measurement interval to be controlled over time durations at which the continuous signal source is energized.

According to an embodiment, the control means can be configured to switch off the continuous signal source at the end of the measurement interval and to switch off at least a part of the comparator circuit in order to obtain a state comparable to a reference state obtained by means of the regeneration phase when the comparator circuit is switched on again for a subsequent measurement interval. In other words, a regeneration phase is not necessarily carried out at the end of the measurement interval, but is obtained by resetting a corresponding part of the comparator circuit by means of the switch-off.

Another embodiment relates to implementing the second circuit portion to include an inverter circuit coupled to the first circuit portion and configured to invert the first intermediate signal to obtain an inverted intermediate signal. The clock signal may be obtained based on the inverted intermediate signal, such as based on direct feedback.

In the context of this fourth embodiment, control means of the apparatus can be configured to terminate an operation of the inverter circuit after a number of at least one measurement interval of the apparatus, and to obtain a state of the comparator circuit comparable to a reference state obtained by means of the regeneration phase for a subsequent measurement interval when the part of the comparator circuit is switched on again. When the inverter circuit is switched on again, the clock signal can be generated again.

Similar to the third embodiment, the regeneration phase for preparing the next measurement interval can thus be obtained by switching off at least part of the comparator circuit, which can also be done easily and without susceptibility to errors.

BRIEF DESCRIPTION OF THE DRAWINGS

Embodiments of the present invention will be detailed subsequently referring to the appended drawings, in which:

FIG. 2a-b show truth tables of different states of an apparatus according to an embodiment;

FIG. 4b shows a schematic representation of exemplary signals of the apparatus of FIG. 4a;

FIG. 5b shows a schematic representation of exemplary signals of the apparatus of FIG. 5a;

FIG. 6b show schematic representation of exemplary signals of the apparatus of FIG. 6a;

DETAILED DESCRIPTION OF THE INVENTION

Figure 1:
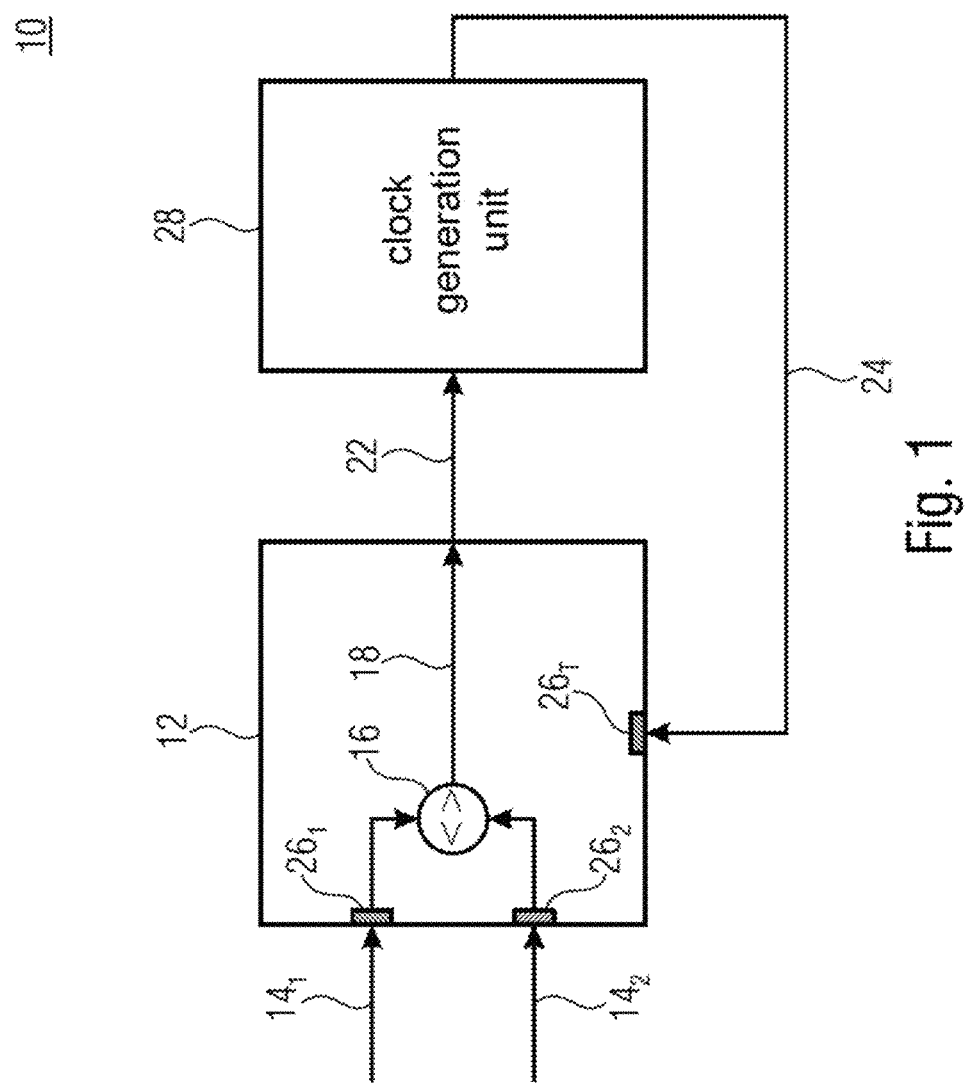
FIG. 1 shows a schematic block circuit diagram of an apparatus according to an embodiment.

Before embodiments of the present invention are explained in detail below with reference to the drawings, it is pointed out that identical elements, objects and/or structures having the same function or acting in the same way are provided with the same reference signs in the different figures, so that the description of these elements shown in different embodiment is interchangeable or can be applied to one another.

Embodiments described below are described in the context of a variety of details. However, embodiments may be implemented without these detailed features. Furthermore, for the sake of clarity, embodiments are described using block circuit diagrams as a substitute for a detailed representation. Furthermore, details and/or features of individual embodiments can be combined with one another easily, as long as not explicitly the contrary is described.

The following embodiments refer in places to different signal levels of signals. Some of these explanations refer to a logic state of this signal or to an interpretation of this signal to a logic state. This can be done, for example, in the sense of an on/off state or in the sense of true/false or, simplified, 0/1. Even if further, additional quantization stages are not excluded here, the embodiments have in common that a corresponding signal level is compared with a threshold value and a certain state is indicated by a signal level, for example true or false. The exact signal amplitude is not limiting and may differ in different embodiments of the invention.

Embodiments relate to the use of a comparator during a comparison phase and to resetting or regenerating the comparator during a regeneration phase. In particular, so-called differential, clocked comparators, i.e. dynamic comparators, are considered. These can be implemented in different ways and can have one, two or more stages. The comparators shown in FIG. 9 or FIG. 10 can be used as examples, but are not restrictive.

In other words, the embodiments described herein can be used to solve the challenges described above, i.e. clock generation in general and dynamic clock change as a function of the input signals (absolute difference+change rate).

On the one hand, embodiments provide for the dynamic comparator to generate its clock for switching the operation phases (comparison phase/regeneration phase) independently or with minimal circuitry addition. Here, the implementation of feedback for the generation of a permanent oscillation is suitable. Furthermore, it is possible for the clock to be also dynamically adjusted depending on the difference and the change rate of the input signals in order to be able to compare the two input signals neither too fast nor too slow, i.e. optimally.

The described embodiments combine both requirements by using the outputs of the comparator, and thus the result of a comparison operation, as the starting point for the feedback.

Some of the embodiments described herein are described in connection with discrete comparators using discrete-value signals, in particular the clock signal, for example binary in the sense of "0"/"1" or "high"/"low". However, the present invention is not limited to this, but can also be applied easily using analog or continuous-value signals, for example by replacing the clock signals of the comparators in FIGS. 7-10 by analog bias signals. By this, a comparator configuration can be obtained, which can also be understood as a continuous-time configuration. In such a configuration, clocked control can be achieved by switching a supply voltage on and off, such as "vdd=high" for an active comparison phase and "vdd=low" for a passive regeneration phase, whereby the latch structures can be reset and thus a self-clocked comparator can be realized again. This means that the output signal clock signal, "CLK" of embodiments described herein, can also be used for switching on or off the comparator, which works for some comparator circuits, but it is important to avoid floating potentials, which e.g. hold a high level, and these would only resolve over time via the unavoidable leakage currents. However, all controls on the defined setting of an internal network/signal can be used to cancel the positive feedback within the latch.

FIG. 1 shows a schematic block circuit diagram of an apparatus 10 according to an embodiment. The apparatus 10 comprises a comparator circuit 12 configured to compare a first input signal $14_1$ with a second input signal $14_2$ during a comparison phase, indicated by a comparison symbol 16. A comparison result 18 indicates which of the input signals $14_1$ and $14_2$ has a larger or smaller signal amplitude. The comparator circuit 12 is configured to output an output signal 22. A waveform of the output signal 22 indicates the comparison result 18. For example, an information content of the output signal 22 may include a level change such that a change in a signal level of the output signal 22 indicates, on the one hand, that there is a comparison result and/or indicates which of the two input signals $14_1$ and $14_2$ has the larger or smaller level values.

Although embodiments described herein are related to the comparison of two input signals $14_1$ and $14_2$, embodiments are not limited to this, so that a larger number of input signals may also be compared, for example using multi-stage comparators.

The comparator circuit 12 is configured to reset at least a part of the comparator circuit for a subsequent comparison phase during a regeneration phase subsequent to the comparison phase, as described in connection with FIGS. 7-10. The regeneration phase allows a subsequent comparison result to be obtained reliably.

The comparator circuit 12 is configured to receive a clock signal 24, and to change from the comparison phase to the regeneration phase based on the clock signal 24.

While the comparator circuit 12 may have signal inputs $26_1$ and $26_2$ to receive the input signals $14_1$ and $14_2$, the clock signal 24 can be received at a signal input $26_T$.

Figure 10:
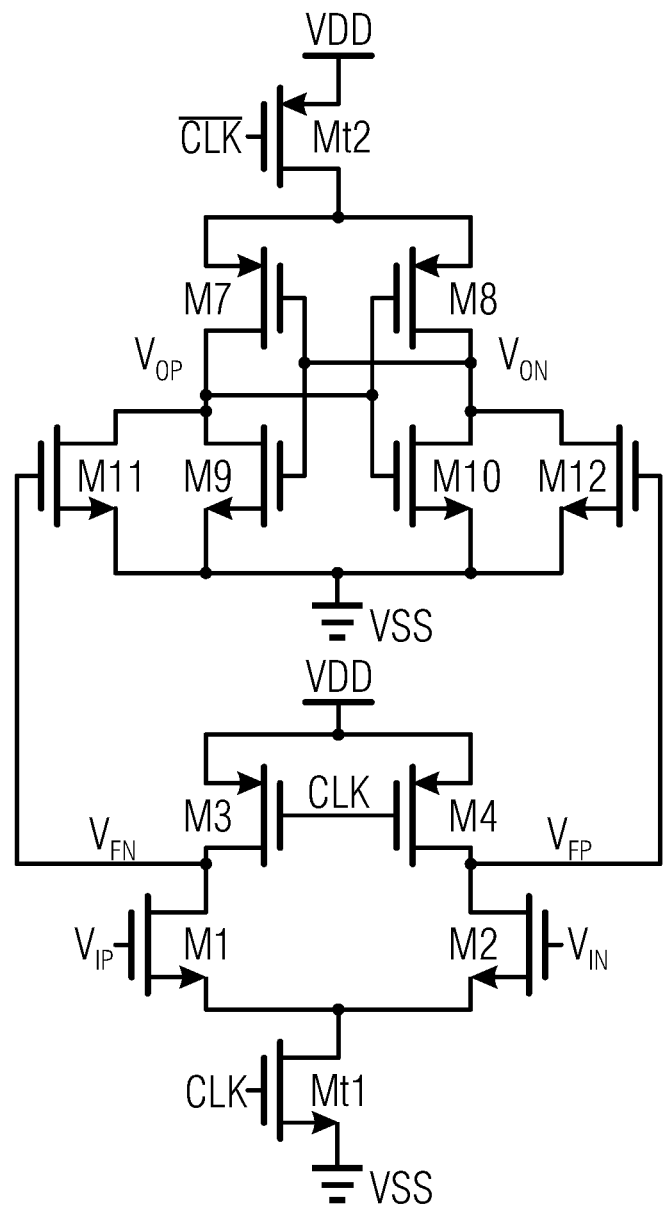
FIG. 10 shows a block circuit diagram as an example of a known discrete-time/clocked or dynamic comparator with a preamplifier, which may be used in embodiments.

Referring to FIG. 10, the regeneration phase can be set, for example, by setting the potentials Von and Vop to a specific potential, such as an operating voltage VDD.

The apparatus 10 further comprises a clock generation circuit 28 configured to receive the output signal 22 or a signal derived therefrom, such as amplified, attenuated or otherwise further processed, while retaining the information content, and to generate the clock signal 24 based on the waveform of the output signal 22. Thus, the comparator circuit 12 is controlled from the comparison phase to the regeneration phase depending on the waveform of the output signal 22.

This feedback makes it possible to implement the apparatus 10 in such a way that it controls the comparator circuit 12 into the regeneration phase only when the comparison result 18 is available, that is not too early, but in such a way that when the comparison result 18 is available no unnecessary waiting times occur either, that is feedback control is also not too late. In particular, in consideration of a dependence of a time period needed to obtain the comparison result 18, it can be recognized that a dynamic clock adjustment is also possible. For example, based on the comparator circuits explained, a time period for obtaining the comparison result may depend on the change rate of the input signals $14_1$ and/or $14_2$. These rates of change may be variable over time and/or may be different for different applications, and embodiments may allow automatic adjustment thereto.

Figure 3A:
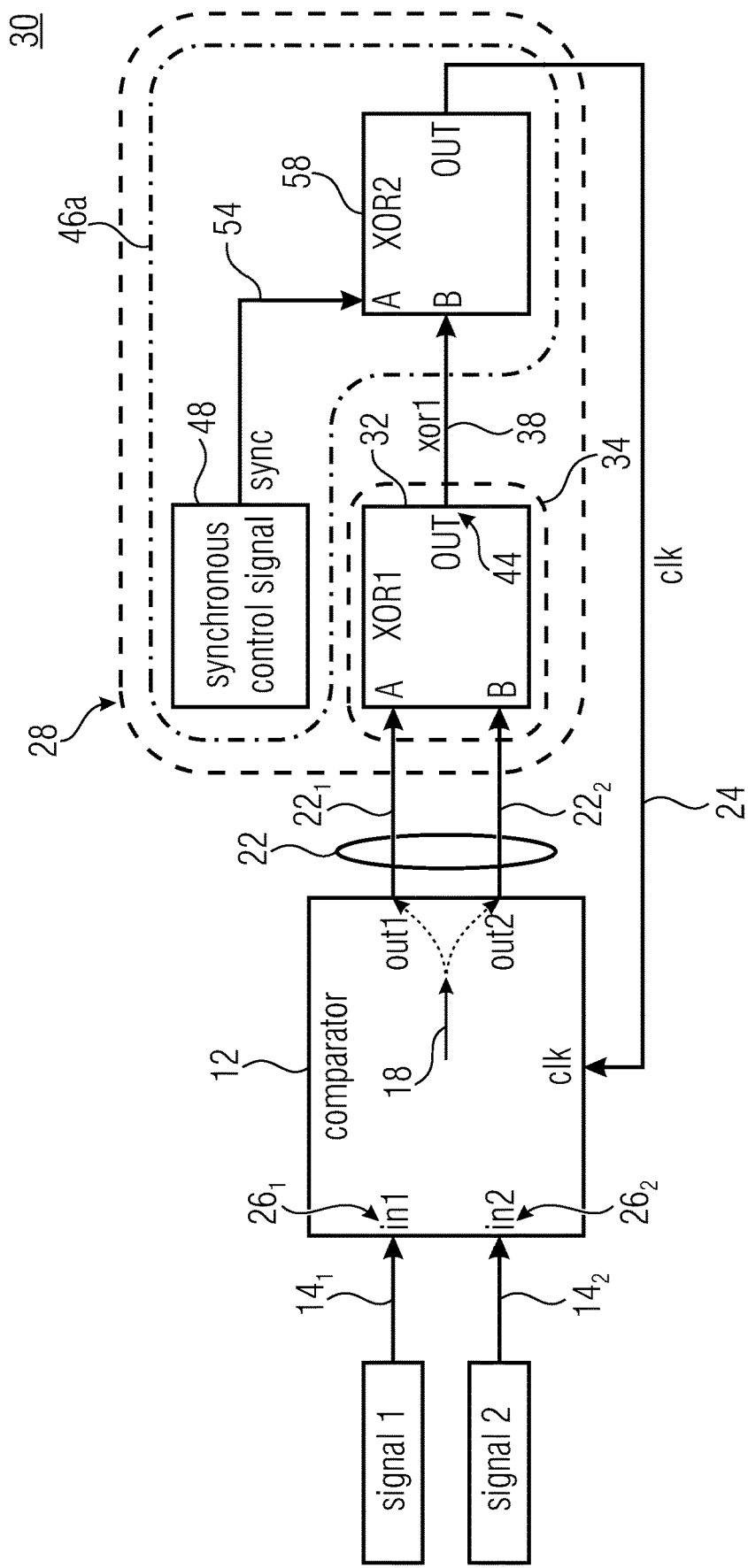
FIG. 3a shows a schematic block circuit diagram of an apparatus according to an embodiment, which has a synchronously operated signal source for clock generation.
Figure 3B:
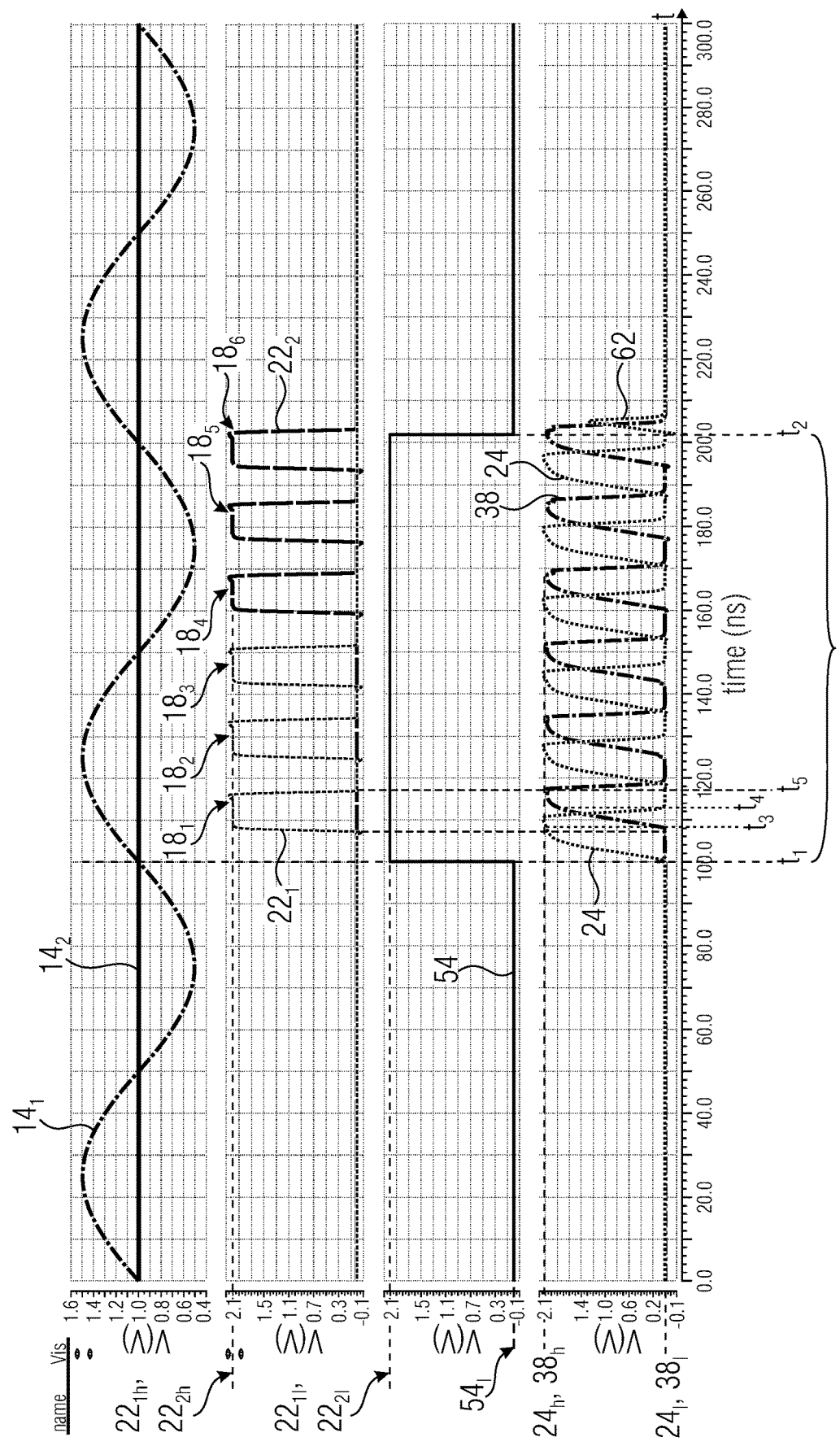
FIG. 3b-d show exemplary representations of waveforms of individual signals in the embodiment of FIG. 3a with different end times of a measurement interval.
Figure 3C:
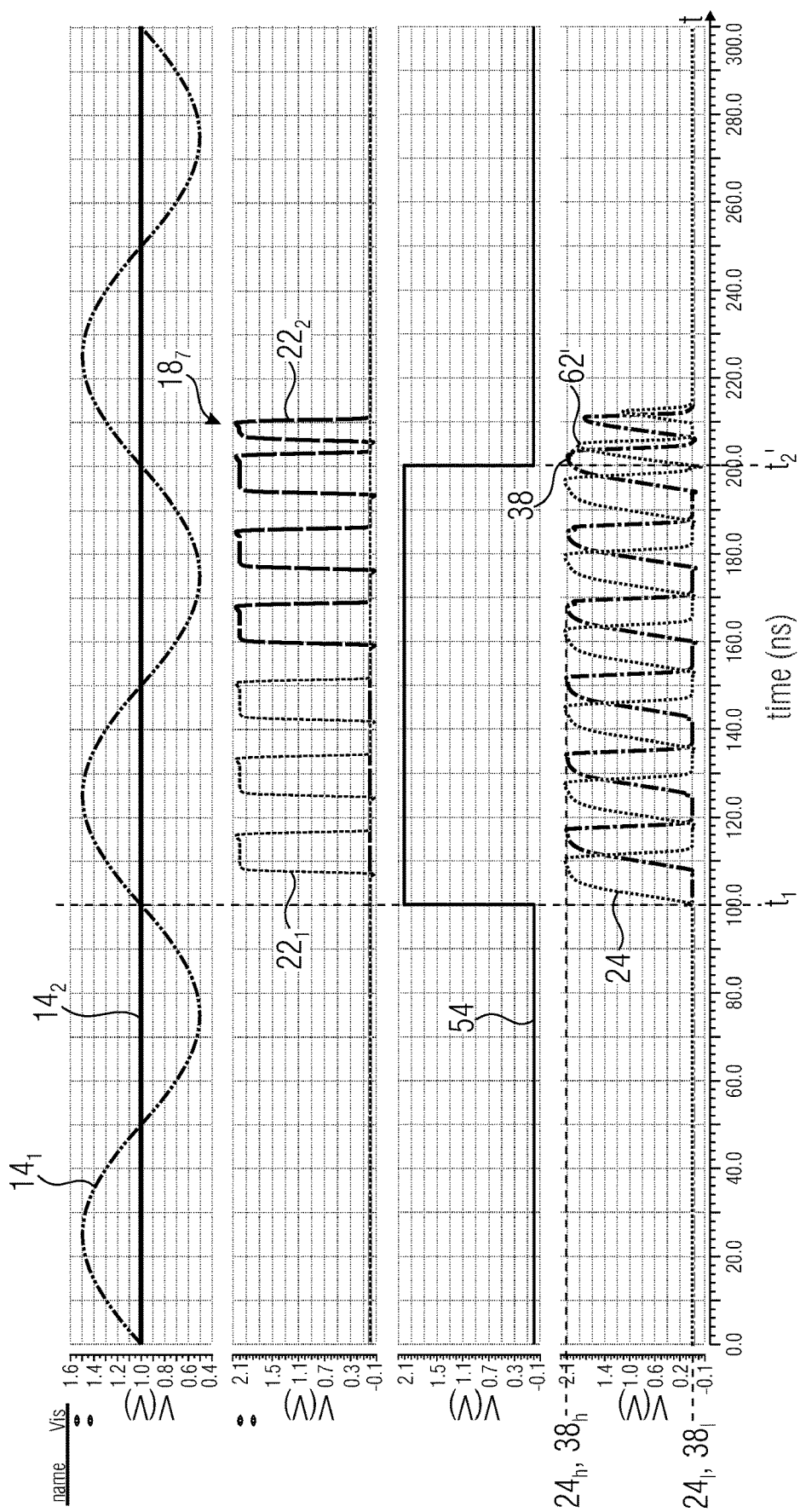
Figure 3D:
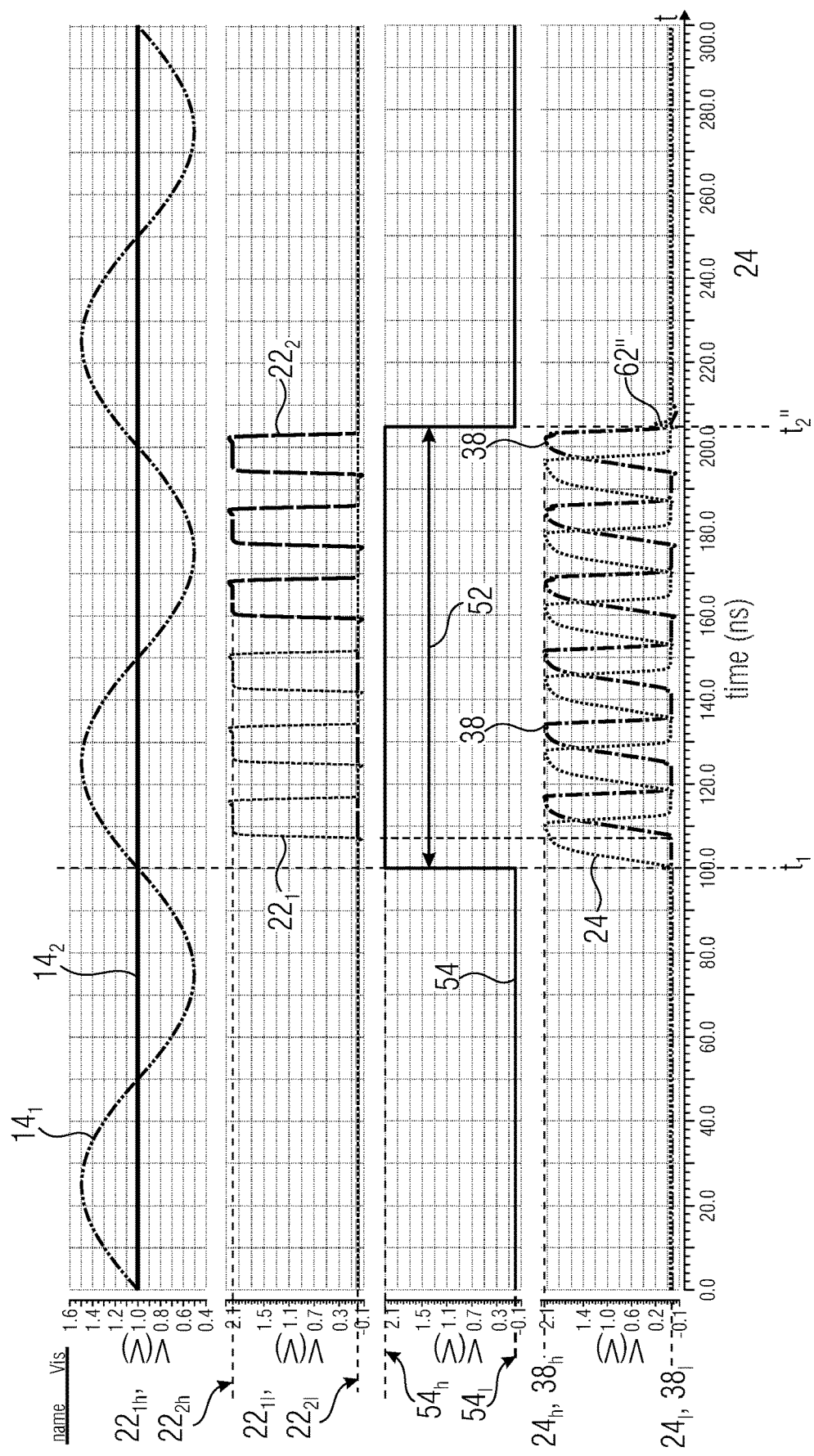

FIGS. 2a and 2b show truth tables of different states of an apparatus 30 according to an embodiment shown as a schematic block circuit diagram in FIG. 3a. In this respect, FIG. 3a shows a principle circuit diagram of an implementation of the present invention. In particular, the embodiment of FIG. 3a shows a principle circuit diagram of a use of a synchronous control signal. FIGS. 3b, 3c and 3d show exemplary signal waveforms for this embodiment. In addition, FIG. 2a shows a truth table for the dynamic comparator and FIG. 2b the truth table for an XOR gate.

Here, FIG. 2a shows a representation of a possible truth table $20_1$ describing the comparator 12 from the apparatus 30 of FIG. 3a. FIG. 2b shows a schematic representation of a truth table $20_2$ of an XOR gate XOR1, which is provided with the reference sign 32 and forms at least a part of a first circuit portion 34. The XOR gate 32 is configured to obtain a first output signal $22_1$ and a second output signal $22_2$ of the comparator 12, which can be provided at signal outputs out1 and out2, respectively, and are based on the input signals $14_1$ and $14_2$ obtained at the signal input in1 and in2, 261/262, respectively. The comparator circuit 12 is configured to provide the output signal 22 of FIG. 1 as a first partial signal $22_1$ and a second partial signal $22_2$. The comparator circuit 12 is configured to indicate the comparison result 18 starting from a reference state obtained by a preceding regeneration phase by means of a level change in exclusively one of the partial signals $22_1$ or $22_2$, which will be explained further in connection with FIGS. 3b, 3c and 3d. This can also be described in such a way that, starting from the reference state, the comparison result 18 is indicated by the fact that only one of the two signals $22_1$ or $22_2$ executes a level change and this level change can be interpreted unambiguously as the signal associated therewith, for example out2 to in2 and out1 to in1 or vice versa, being larger or smaller than the other signal.

In FIG. 2a, this sequence is shown in different rows of the truth table $20_1$. In a first row $36_1$, for example, the comparator circuit 12 is in the reference state and the input signals $14_1$ and $14_2$ are not yet of concern. The clock signal 24, with an exemplary value of logic 0, indicates that the comparator circuit 12 is in the regeneration phase. Based on this, the two partial signals $22_1$ and $22_2$ are, for example, logic 0, wherein the logic states described herein are also readily invertible without departing from the mode of operation of embodiments described herein.

In a second line $36_2$, a comparison phase is performed in which a signal amplitude of the signal $14_1$ is smaller than a signal amplitude of the signal $14_2$. In a third line $36_3$, a complementary state is shown in which a signal amplitude of the signal $14_1$ is larger than a signal amplitude of the input signal $14_2$. The comparison phase is recognizable by the value logic 1 of the clock signal 24, also described as clock, clk.

Differences between lines $36_2$ and $36_3$ arise based on the different ratios between input signals $14_1$ and $14_2$ in partial signals $22_1$ and $22_2$. While in line $36_2$ the partial signal $22_2$ indicates that the input signal $14_2$ associated therewith is greater than the input signal $14_1$, in line $36_3$ the partial signal $22_1$ indicates that the input signal $14_1$ associated with signal output out1 is greater than a signal amplitude of the input signal $14_2$.

For the sake of completeness, reference is made to line $36_4$, where both signal amplitudes of the input signals $14_1$ and $14_2$ are approximately equal and yet a comparison phase is executed, clk=1. This results in one of the states, either $22_1$=0 and $22_2$=1 or $22_1$=1 and $22_2$=0. In other words, only one of the two signals $22_1$ and $22_2$ changes to the other state starting from the reference state of line $36_1$.

The truth table $20_2$ shows different states of the XOR gate 32.

After the regeneration phase has been executed, which is shown in line $42_1$ corresponding to line $36_1$, the XOR gate 32 receives the partial signals $22_1$ and $22_2$, at least in terms of information content. This state is indicated at an output of the XOR gate as an output signal 38 with a first state, for example logic 0.

In lines $42_2$ and $42_3$, corresponding to lines $36_2$ and $36_3$, on the other hand, the behavior of the comparator circuit 12 in that only one of the signals $22_1$ and $22_2$ has changed state may cause the output signal 38 to change state in both cases in unison starting from the reference state of line $42_1$, thus indicating the presence of the comparison result 18 in the comparator circuit 12.

Line $43_4$ corresponds to a theoretical state in which both partial signals $22_1$ and $22_2$ have the value of logic 1, but embodiments prevent this due to the comparator circuit. In embodiments, it is provided for both outputs of the comparator to be equal only at times when the clock signal 24 has the value "0", which can be described with the value "0" in the examples shown and implemented with the complementary state of "1" in further embodiments. In other states, the outputs of the comparator are different from each other.

Looking at FIGS. 2a and 2b, it is clear that a signal waveform or level change in the output signal 22 or the partial signals $22_1$ and $22_2$ can be processed using the circuit portion 34 so as to obtain an output signal 38, also referred to hereinafter as a first intermediate signal or xor1, which indicates whether or not a comparison result is present. The circuit portion output 44 used for this purpose may be part of the XOR gate 32, but this does not prevent post-processing of the signal in other embodiments as long as the information content of the signal 38 is unaffected by this.

The apparatus 30 further comprises a further circuit portion 46a configured to derive the clock signal 24 from the intermediate signal 38.

For example, the circuit portion 34 may be formed as a first XOR gate and the first partial signal $22_1$ and the second partial signal $22_2$ may be coupled to inputs of this XOR gate.

This configuration of comparator circuit 12 and circuit portion 34 may also be the basis for further implementations in which the circuit portion 46 is formed differently.

The apparatus 30 is configured such that the circuit portion 46a comprises a signal source 48 configured to provide a control signal 54 having a first control signal level $54_h$ at least for the duration of a measurement interval 52 shown, for example, in FIGS. 3b, 3c, and 3d during the at least one comparison phase for obtaining at least one comparison result $18_1$ to $18_6$. Furthermore, the circuit portion 46a includes a second XOR gate 58 connected on the input side to the signal source 48 for obtaining the control signal 54. Furthermore, the second XOR gate is coupled to the circuit portion 34 and in particular to the XOR gate 32 and its output 44 to receive the intermediate signal 38. The XOR gate 58 is configured to provide the clock signal 24 based on a combination of the control signal 54 and the intermediate signal 38.

Referring to FIG. 3b, the effect of the control signal 54 is explained in more detail.

FIGS. 3b, 3c and 3d each show four graphs on a matching time axis t, with different signals of the apparatus 30 shown in the different graphs. Thus, on the one hand, the input signals $14_1$ and $14_2$ are shown in exemplary form and comparative to each other.

Furthermore, the partial signals $22_1$ and $22_2$ are shown for indicating, by way of example, six comparison results $18_1$ to $18_6$.

The control signal 54 of the signal source 48 is shown in a separate graph, whose level of exemplarily "high" $54_h$ determines a time duration of the measuring interval 52. The measuring interval 52 extends, for example, starting from a time $t_1$ at approximately 100 ns to a time $t_2$ at approximately 204 ns.

In another graph, the clock signal 24 and the intermediate signal 38 are shown comparatively.

Starting from the time $t_1$, referring to FIG. 3a, the control signal 54 now changes to the signal level $54_h$, which, referring to the truth table $20_2$, even though a different XOR gate is shown here, causes the clock signal 24 to also change to the high level, which is shown at the time $t_3$. A comparative result, the comparison result $18_1$ of the input signals $14_1$ and $14_2$, is shown for example in the partial signal $22_1$, that is with a time delay needed for switching transistors and the like. Thereupon, as soon as the intermediate signal 38 exceeds the evaluation threshold of, exemplarily, approximately 0.9 volts for a 1.8-volt technology circuit, like approximately at a time $t_4$, the XOR gate 58 changes to the state shown in line $42_4$ of the truth table $20_2$, namely that both input signals have a high level, 1. As a result, the clock signal 24 falls back to the low level and the regeneration phase begins due to the level change.

This can cause the partial signals $22_1$ and $22_2$ to return to the reference state of line $42_1$, which is shown at time $t_5$, when the signal $22_1$ returns to a low level $22_1$l. After completion of the regeneration phase, at which the state of line $42_1$ is obtained, the two signals 38 and 54 are again different from each other with respect to their level, which is why a renewed level change takes place in the clock signal 24, which, fed back to the comparator circuit 12, causes a renewed comparison phase to obtain the comparison result $18_2$.

It is clear from this that the presence of the comparison result initiates the regeneration phase and the completion of the regeneration phase in turn initiates the next comparison phase.

Thus, the apparatus 30 comprises a self-clocked comparator circuit. It is further apparent that for shorter durations to obtain the comparison results $18_1$ to $18_6$, it is also possible to return to the respective regeneration phase more quickly so that if obtained more quickly, for example, one of six greater numbers of comparison results could be obtained in the measurement interval 52. Conversely, should more time be needed to obtain the comparison result, fewer results will be obtained, but the reset by the regeneration phases is still coordinated with the circuit of FIG. 3a.

The signal source 48 may be configured to change the control signal 54 to the control signal level $54l$ for terminating the measurement interval 52 only at times when the intermediate signal 38 has a low level $38_l$, which may also be interpreted as a regeneration level. While a high level $38_h$ indicates that a comparison result is present, a low level may indicate that the reference state has been obtained, or is present. In this respect, an operation or behavior of the signal source may be synchronized with further circuit components, which is why the signal source may also be referred to as a synchronized signal source.

The fact that the synchronized signal source 48 only transfers the control signal 54, also referred to as sync, to the control signal level $54l$ at times when the intermediate signal 38 is at level $38_l$ prevents an additional comparison result $18_7$ from being obtained, as shown for example in FIG. 3c. Compared to the signal curve of FIG. 3b, only a falling edge of the signal 54 is brought forward to a time $t_2$', where the intermediate signal 38 is still at a level $38_h$. This does not reliably prevent the immediate switch-off, but a further comparison operation is performed which leads to the comparison result $18_7$.

In contrast, FIG. 3d shows signals of the apparatus 30 in a configuration in which the end of the measurement interval 52 occurs later, namely at about 205 ns, with the same start at the time $t_1$. It is clear that an increase 62 of the clock signal 24 apparent in FIG. 3b, which there remains without consequences as an increase 62' in FIG. 3c but triggers a new measurement interval, remains without consequences in FIG. 3d as an increase 62", since here the level of the intermediate signal 38 is at $38_l$.

In principle, it is also possible not to limit the measurement interval 52 in time, for example if continuous measurements are desired. Within the measurement interval, the apparatus 30, like the apparatus 10, is configured to generate the clock signal 24 automatically and as a function of the input signals $14_1$ and $14_2$.

The clock generation circuit 28 is configured to generate a level change in the clock signal, see lines $42_2$ and $42_3$ of truth table $20_2$, triggered by a level change in the output signal, see lines $36_2$ and $36_3$ of truth table $20_1$, respectively, starting from line 361, which indicates that the comparison phase is completed and the comparison result 18 is present. The level change in the clock signal triggers a change from the comparison phase to the regeneration phase. A completion of the regeneration phase in turn triggers a level change in the clock signal 24, which triggers a subsequent comparison phase. However, if the measurement interval 52 has ended before, the next comparison phase is not executed again until a subsequent measurement interval. This can also be carried out combinatorially in the sense of an on/off behavior, so that the clock generation circuit 28 is exemplarily configured to generate a first level change in the clock signal 24, for example a rising edge, which triggers a change from the first comparison phase to the regeneration phase, triggered by a level change of the output signal 22 indicating that the comparison phase has been completed and the comparison result 18 is present. Completion of the regeneration phase triggers a further level change in the clock signal 24, which triggers the subsequent comparison phase.

As has been explained, a time duration of the comparison phase may be dependent on the input signals 14$_1$ and 14$_2$. The apparatus 10 and/or 30, as well as other embodiments described herein, may be configured to generate a clock rate of the clock signal 24 as a function of the time duration of the comparison phase.

In other words, the differential output signals 22$_1$/22$_2$ or out1 and out2 are fed into a subsequent XOR gate. If the comparator is in its passive regeneration phase, both outputs are at the same logic level and xor1 provides a logic 0. If the comparator is in its active comparison phase, both outputs must differ from each other.

This is the case even if both inputs of the comparator have the same signal applied. In this case, the inherent thermal noise of the transistors and the enormously large gain of the internal positive feedback trigger a comparison operation. Thus, the logic levels at the input of the following XOR gate are different and a logic 1 is output.

However, in order not to have to rely on thermal noise for an initial ignition of the self-oscillation and, in the sense of further application, also to allow control of the comparator activity, a second XOR gate XOR2 is connected downstream of the first. Here, the second input of the second XOR gate is provided with a synchronous control signal "sync". This is synchronous because it may only change its logic level if the generated intermediate signal 38 (xor1) is a logic 0. If a change is made at any other time, self-oscillation may be stopped, but the outputs of the comparator will retain their current value until the next enabling. This could result in static errors in the subsequent signal processing chain.

If the output of the first XOR gate XOR1 is a logic 0 and the control signal sync is also a logic 0, the comparator is in its passive regeneration phase or is held in this phase. Thus, both output signals out1 and out2 are logic 0.

If the output of the first XOR gate is logic 0 and the control signal is logic 1, the second XOR gate XOR2 outputs a logic 1 and the comparator is set from its passive regeneration phase to the active comparison phase. As a result of the comparison operation, the two output signals out1 and out2 must then be logically different from each other.

If the output of the first XOR gate is a logic 1 and the control signal is a logic 1, the second XOR gate outputs a logic 0 and the comparator is set from its active comparison phase to the passive regeneration phase and the oscillation cycle starts again.

Based on the truth tables of the comparator and the XOR gates in FIG. 3a, it can now be set into self-oscillation by feeding back this logic signal to its clock input. The control signal sync can be used to enable or disable this oscillation loop.

With the addition of two XOR logic gates and a control signal, a dynamic comparator can on the one hand generate the needed clock itself and on the other hand vary it dynamically. If the absolute difference of the two comparator signals on the input side is large, the output of the comparator will change faster than if the difference on the input side is small. However, since the switching speed of the clock in the present concept is directly dependent on this change, the next clock period can only be triggered after a comparison operation has been performed. The self-generated clock can thus never be too fast and at the same time changes dynamically depending on the input signals at the comparator.

Compared to the described conventional technology, the clock of a dynamic comparator can be generated with very little effort in terms of complexity and power requirements and at the same time be adjusted dynamically to the optimal clock frequency. Thus, the advantages of a dynamic comparator in terms of high sensitivity and fast response speed as well as low space requirements and low power consumption can be maintained.

Figure 4A:
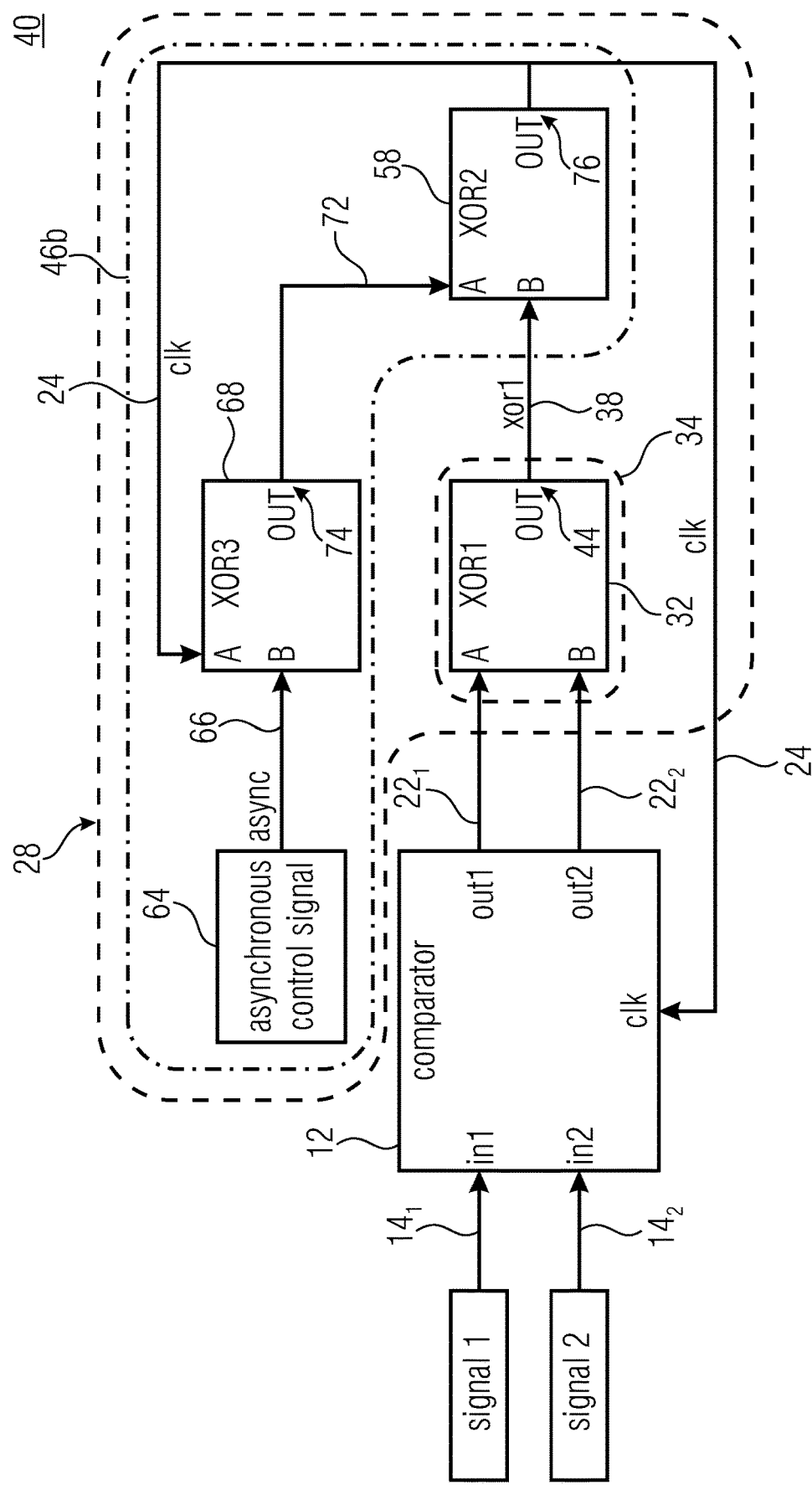
FIG. 4a shows a schematic block circuit diagram of an apparatus according to an embodiment, which has an asynchronously operated signal source for clock generation.

FIG. 4a shows a schematic block circuit diagram of an apparatus 40 according to an embodiment which is modified regarding the apparatus 30 with respect to the circuit portion 46 and has a circuit portion 46b in the clock generation circuit 28 which is modified with respect to the circuit portion 46a. The embodiment makes it possible to use an unsynchronized signal source 64 capable of outputting an unsynchronized or asynchronous control signal 66, instead of a signal source 48 synchronized with respect to the end of the measurement interval 52. The signal source 64 can be the same signal source as the signal source 48 and differ only with regard to a lack of synchronization, i.e. in the operating mode, but can also be a different signal source.

To compensate for the lack of synchronization, the circuit portion 46b includes another XOR gate 68. Compared to the apparatus 30, the XOR gate 68 receives both the clock signal 24 for combination and the control signal 66. A second intermediate signal 72 obtained therefrom, denoted xor3, forms the basis for a signal input of the XOR gate 58 in this embodiment, instead of the control signal 54 of FIG. 3a.

Figure 4B:
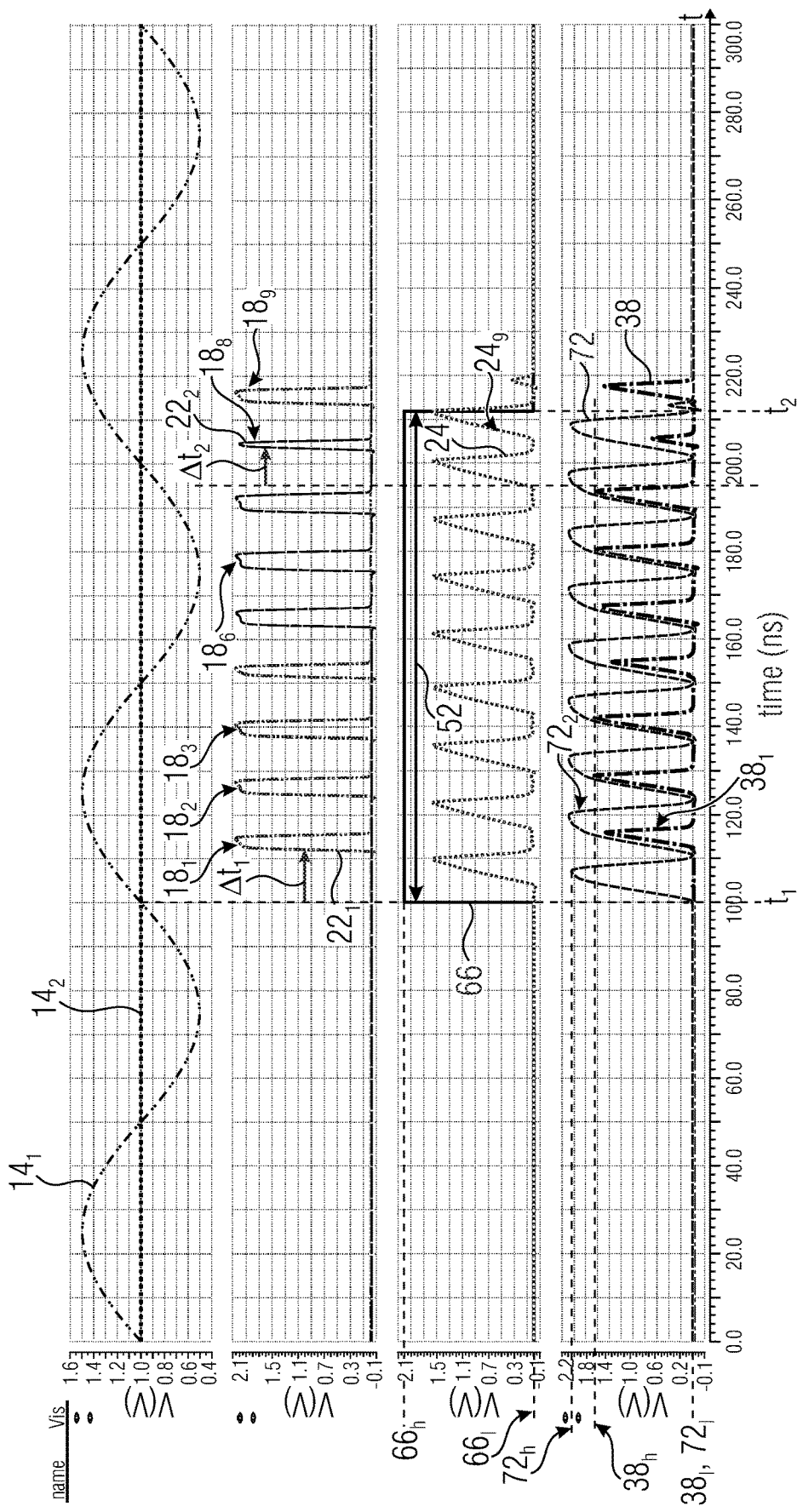

In other words, the circuit portion 46b comprises a signal source 64 configured to provide the control signal 66 having a first control signal level 66$_h$, see FIG. 4b, for the duration of the measurement interval 52 for performing at least a comparison phase. Furthermore, XOR gates 58 and 68 are provided. An output of the XOR gate 68 is coupled to an input of the XOR gate 58. Another input of the XOR gate 58 is coupled to the circuit portion output 44 to receive the intermediate signal 38. The XOR gate 68 in turn is configured to provide, at a signal output 74 based on the combination of the signals 24 and 66, an intermediate signal 72, denoted xor3, which forms the further input to the XOR gate 58, in substitution for the signal 54 compared to FIG. 3a.

The XOR gate 58 is configured to provide, based on a combination of the intermediate signal 38 and the intermediate signal 72, the clock signal 24 at an output 76 of the XOR gate 58, which in turn is coupled to the comparator circuit on the one hand and to the corresponding input of the XOR gate 68 on the other hand.

FIG. 4b shows a schematic representation of signals 14$_1$ and 14$_2$, 22$_1$ and 22$_2$, 24 and 66, and 38 and 72 in a respective diagram with matching time axis t.

A start of the measuring interval 52 is also at t=100 ns, wherein the time t$_2$ can be at any time. The comparison result 18$_9$ is triggered by an increase 24$_9$ of the clock signal 24, which lies within the measurement interval 52. The time delay implemented by the components becomes clear from this.

With respect to the signal source 48, the signal source 64 may be configured to provide the control signal 66 during the measurement interval 52 with a signal level 66$_h$ that logically corresponds to a result signal level 38$_h$ of the intermediate signal 38. This indicates that a respective comparison result is present. For example, an increase 38$_1$ may indicate that the comparison result 18$_1$ is applied. As can be seen, for example, in the comparison of signals 38 and 72, different signals may have different levels and yet both may have the respective high or low level. That is, logically or interpreted, an increase $72_2$ corresponds to the increase $38_1$.

A regeneration level $38_l$ of the intermediate signal 38 indicates that the regeneration phase is executed and is different from the result signal level $38_h$. The signal source 64 is configured to change, for example reduce, a termination of the measurement interval 52 by changing the control signal from the control signal level $66h$ to a level $66_l$ different therefrom. This initiates termination of the measurement interval. The apparatus is configured to change the intermediate signal 72 by coupling to the output of the XOR gate 58 through the XOR gate 68 when the control signal 66 changes to the level $66_l$ to a state logically corresponding to the regeneration level $38_l$, i.e. the state $72l$, exclusively at times at which the intermediate signal 38 has the regeneration level $38_l$. This also prevents a new measurement from being started and at the same time ensures that the comparator is regenerated in a subsequent comparison interval.

In FIG. 4b, time shifts $\Delta t_1$ and $\Delta t_2$ can be recognized, indicating a period of time between sampling the input signals $14_1$ and $14_2$ and a corresponding comparison signal $18_1$ and $18_8$, respectively, being present.

In other words, the XOR gate 68 performs the function of a delay element to keep the intermediate signal 72 in the event of a premature switch-off of the asynchronous signal source 64 still at an active state until the switch-off of the intermediate signal 38 also allows a falling edge in the clock signal 24.

Both the apparatus 30 and the apparatus 40 may be configured to effectively terminate the measurement interval 52 exclusively at a time when the intermediate signal 38 has a regeneration level $38_l$ indicating that the comparator circuit is regenerated for a subsequent comparison phase. In the case of apparatus 30, this may be accomplished by synchronization of the signal source or by a delay element through the XOR gate 68.

In other words, FIG. 4a shows a principle circuit diagram with asynchronous control signal. FIG. 4b shows simulated signal waveforms for this embodiment. It can be seen in this embodiment that by adding an additional third XOR gate XOR3, the control of self-oscillation can also be realized with an asynchronous control signal async. The principle circuit diagram can be seen in FIG. 4a and the simulated signal waveforms in FIG. 4b.

Basically, the self-oscillating control loop operates using the XOR gates XOR1 and XOR2 as described in the previous example. However, in order to be able to realize control with an asynchronous control signal async, the clock signal clk is not only applied to the comparator, but also to the third XOR gate XOR3. This results in two competing loops which converge at XOR2.

In the initial state, async=0 and clk=0. Thus, xor1=0 and xor3=0 and the comparator is in its passive regeneration phase.

If the oscillation is now enabled via async=1 (xor1 remains 0 for the time being), clk jumps to logic 1 and the comparator changes to the active comparison phase. At the same time, however, xor3 must change to 0, which causes clk to drop to 0 again. Since there is a certain time delay within the logic gates, the change of clk via XOR3 will come only when the comparator has already seen a 1 at its clock input long enough.

As a result of the comparison operation, the two comparator outputs out1 and out2 are logically different from each other and xor1 jumps to 1. Meanwhile, xor3 changes back to 1 via the feedback from XOR3 and clk becomes 0 again. Thus, the comparator changes back to the passive regeneration phase and the cycle starts again.

Since the loop via XOR3 is fundamentally faster than the loop via the comparator, there is a lag effect when disabling the self-oscillation via the control signal async. Depending on the time of disabling, another comparison operation can thus be performed before the comparator stops its function and both outputs are at logic 0 again.

Figure 5A:
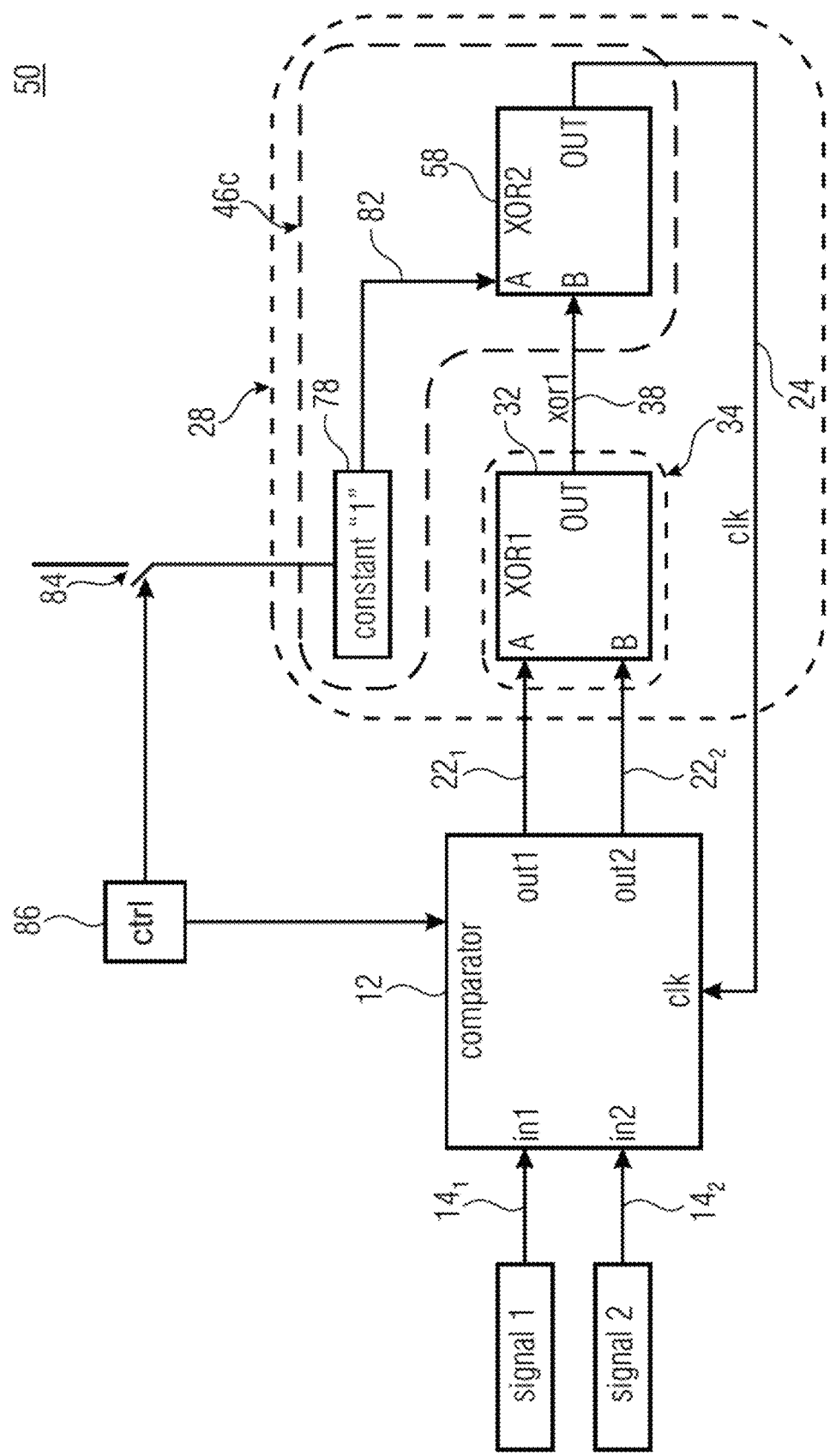
FIG. 5a shows a schematic block circuit diagram of an apparatus according to an embodiment, which has a continuous signal source as a signal source.

FIG. 5a shows a schematic block circuit diagram of an apparatus 50 according to an embodiment, which has a circuit portion 46c that is modified compared to the circuit portion 46a of FIG. 3a and the circuit portion 46b of FIG. 4a. Compared with the representation of FIG. 3a, the circuit portion 46c has a continuous signal source 78 configured, for example, to provide a constant control signal 82. In the illustrated embodiment, the constant control signal is permanently provided with a level of logic 1, wherein this embodiment can be readily inverted by inverting other circuit components as well. Unlike the synchronous signal source 48 or the asynchronous signal source 64, the constant signal source 78 can permanently provide the signal 82 during an operation thereof.

Figure 5B:
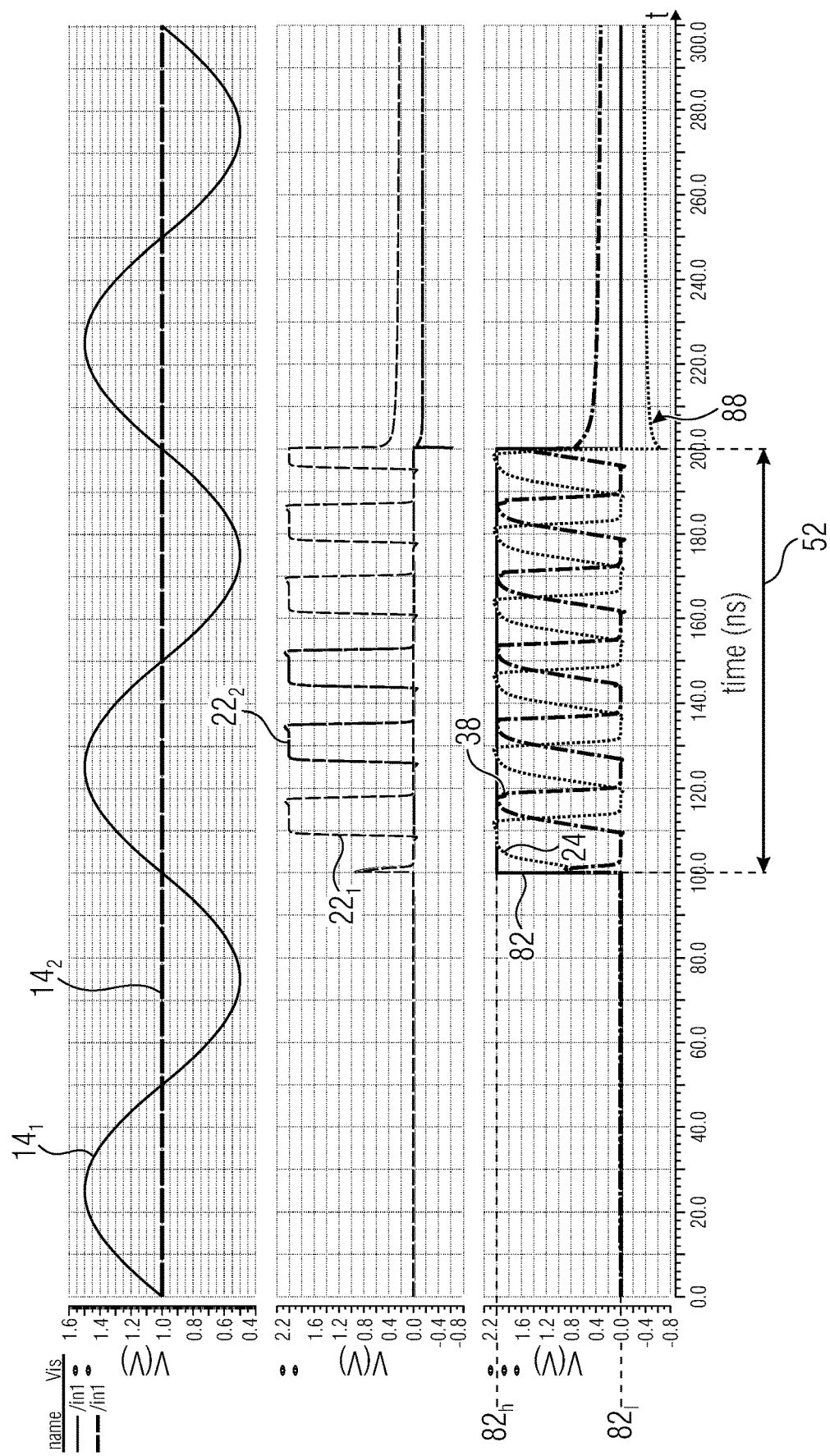

FIG. 5b shows a schematic representation of exemplary signal waveforms of the apparatus 50 based on three comparisons of signals, $14_1$ and $14_2$ on the one hand, $22_1$ and $22_2$ on the other hand, and further of signals 24, 38, and 82. The measurement interval 52 may be accomplished other than by controlling the signal sources 48 and 64, respectively, by switching the continuous signal source 78 on and/or off, for example using a switch 84. That is, the switch 84 may be configured to place the continuous signal source in an operating state or out of an operating state. The switch 84 may be formed as a power semiconductor, for example, but may also comprise another type of switch. As an alternative to placing the continuous signal source 78 into operation or not, the switch 84 may also be disposed, for example, in a signal path of the constant control signal 82 toward the XOR gate 58 to interrupt that signal, although this may involve additional measures to provide a valid potential for the XOR gate 58.

In both embodiments, control means 86 can be provided which is configured to supply the continuous signal source 78 and the comparator circuit 12 with energy for operating the continuous signal source and the comparator circuit for the duration of the measurement interval 52 for executing at least a comparison phase. Alternatively or additionally, only the continuous signal can be switched off and/or the XOR gate XOR2 or 58 can no longer be supplied with power and/or further, possibly all, blocks with respect to power supply can be switched off. Thus, in embodiments, the blocks may be designed such that the entire logic is set to "high active", that is a signal level high is associated with operation. Switching off the power supply in such a case can generate a low level and thus produce the defined and stable output states.

The apparatus 50 includes the XOR gate 58 coupled on the input side to the continuous signal source 78 and to the circuit portion 34. The XOR gate 58 is configured to provide the clock signal 24 based on a combination of the constant control signal and the intermediate signal 38. In circuit technology terms, an effect similar to that of the apparatus 30 can be achieved, but the defined state is obtained by disabling the comparator circuit 12 and/or switching off the control signal is obtained by disabling the constant signal source 78.

According to an embodiment, the control means 86 is configured to switch off the continuous signal source 78 at the end of the measurement interval 52 and to also switch off at least a part of the comparator circuit 12 in order to obtain a state comparable to a reference state obtained by means of the regeneration phase when the comparator circuit 12 is switched on again for a subsequent measurement interval.

Voltage spikes 88 in FIG. 5b in the clock signal 24 can be obtained both when the supply voltage is switched on and when it is switched off, such as VDD and possibly remaining voltage offsets, at the switch-off moment and are due to capacitive coupling or other effects.

According to the principle circuit diagram in FIG. 5a, a constant signal is applied to input A of the second XOR gate. To maintain self-oscillation, this signal is to have a logic high level and can be implemented, for example, directly via a connection to the positive supply potential "vdd".

Assuming that all functional blocks shown in FIG. 5a are operated via this supply potential, the simulated signal waveforms shown in FIG. 5b result.

Without an applied voltage supply vdd, all internal nodes are at 0V=vss=ground. a sufficient supply voltage vdd applied at 100 ns, two different levels are present at the input of XOR2. One is 1 from vdd and the other is 0 from xor1. Thus, the signal clk has to jump from 0 to 1 and the comparator has to change to the active comparison phase.

As a result of this comparison operation, the outputs out1 and out2 have different logic levels and xor1 jumps to 1. Thus, the same logic levels are now present at the inputs of XOR2 and clk jumps to 0, whereby the comparator changes to the passive regeneration phase. Thus, both outputs out1 and out2 become 0 again, xor1 also becomes 0 and the cycle starts again.

Since no control via a control signal is provided, this self-oscillation can only be interrupted by interrupting the supply voltage vdd, such as at 200 ns.

The spikes at the switch-on moment of vdd and the residual voltage offsets at the switch-off moment of vdd are due to capacitive coupling and non-ideal circuit components.

FIG. 5a shows a principle circuit diagram with a constant control signal and FIG. 5b shows simulated signal waveforms for this embodiment.

Figure 6A:
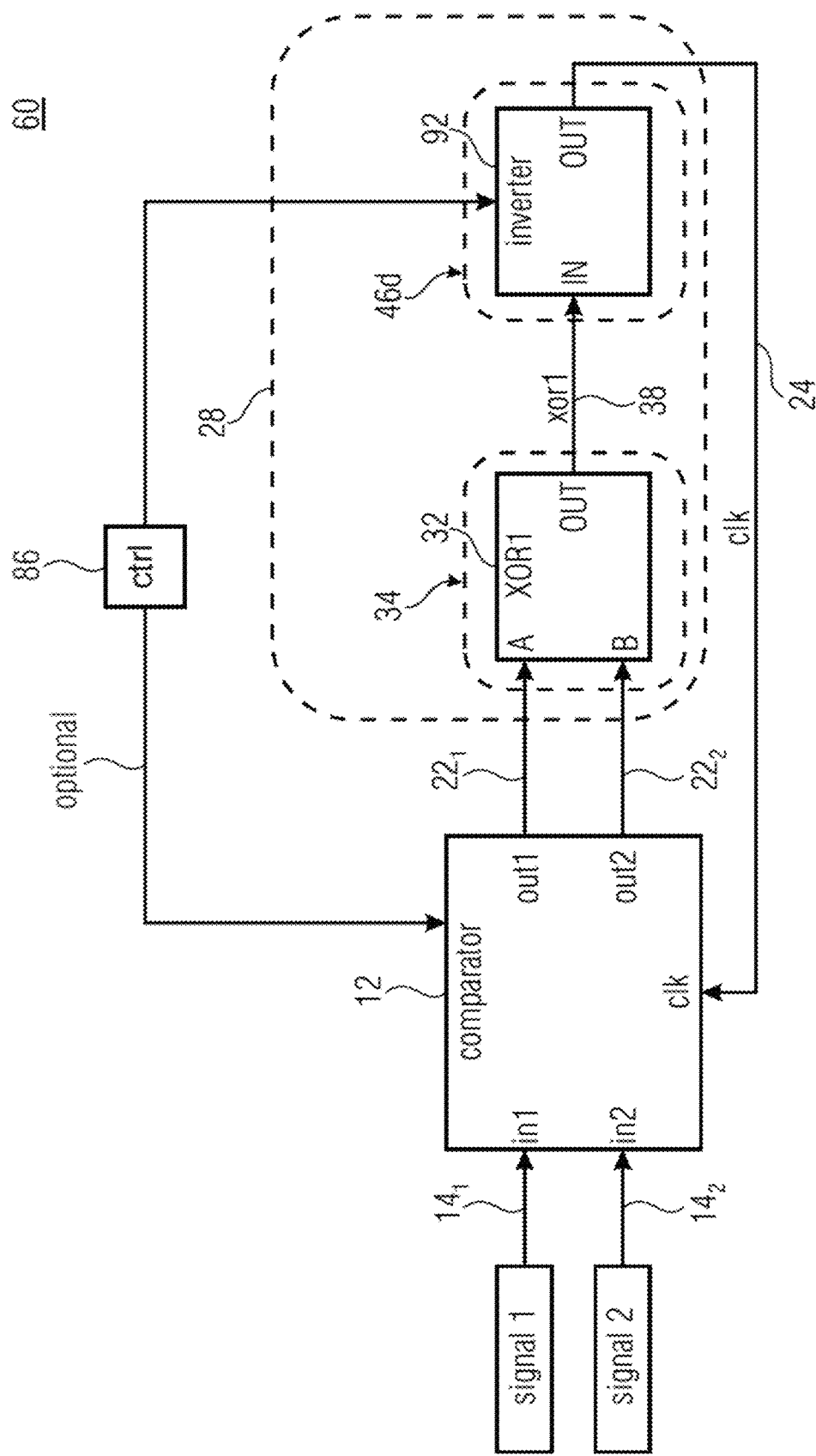
FIG. 6a shows a schematic block circuit diagram of an apparatus according to an embodiment in which a clock generation circuit comprises an inverter circuit.

FIG. 6a shows a schematic block circuit diagram of an apparatus 60 according to an embodiment in which the clock generation circuit 28 has a circuit portion 46d that is modified from the representations in FIGS. 3a, 4a, and 5a and includes an inverter circuit 92.

Figure 6B:
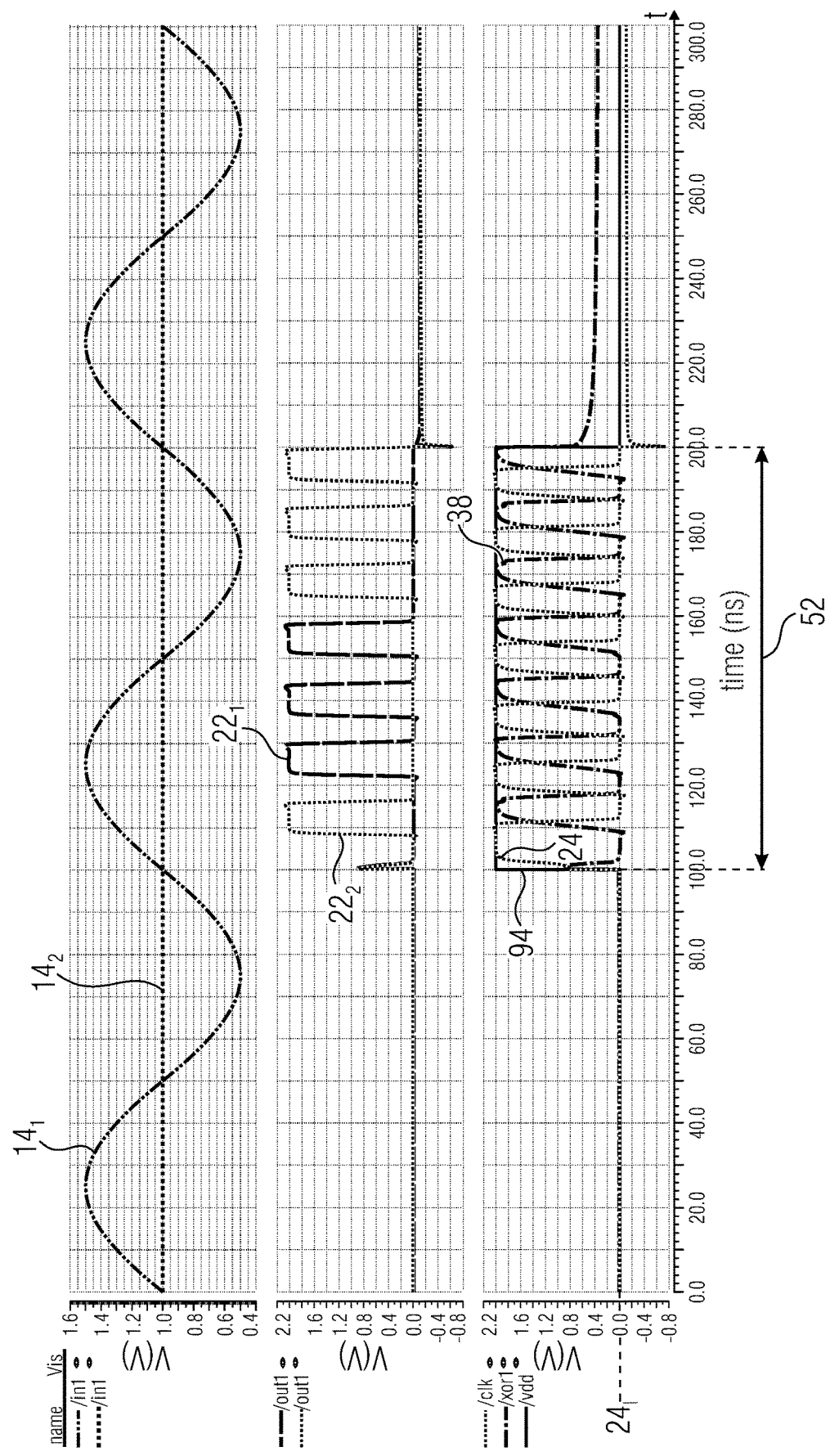
Figure 7:
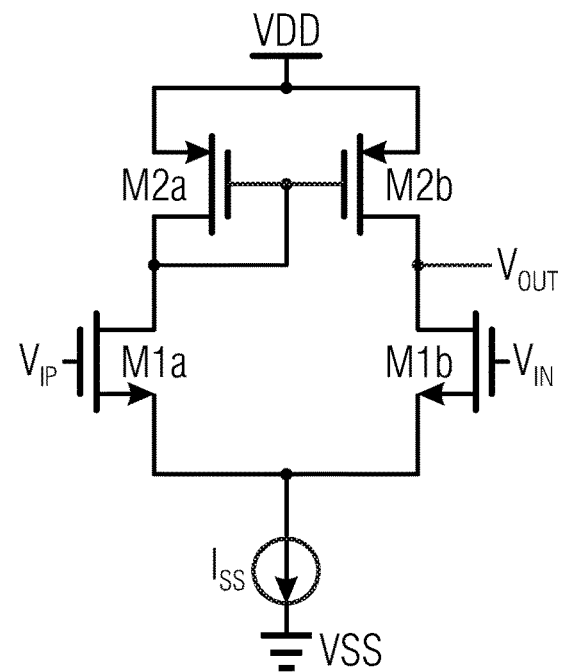
FIG. 7 shows a block circuit diagram as an example of a known static comparator.
Figure 8:
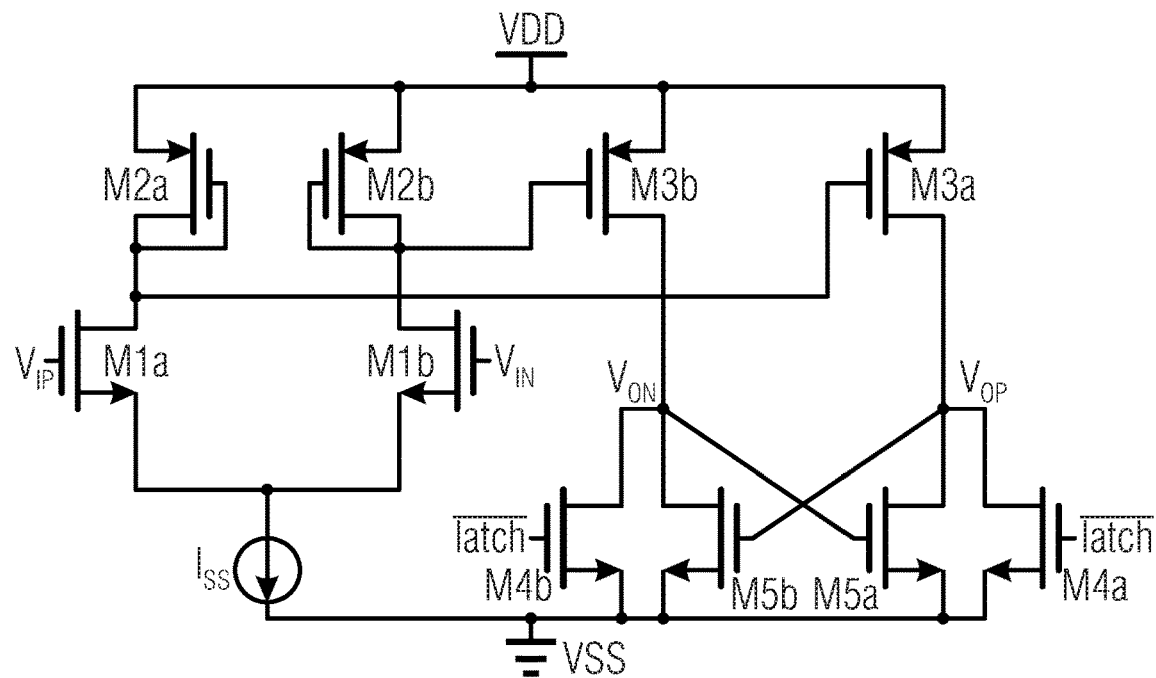
FIG. 8 shows a block circuit diagram as an example of a known statically latched comparator.

FIG. 6b shows examples of simulated signal waveforms for the principle circuit diagram of an embodiment without an additional control signal shown in FIG. 6a.

The inverter circuit 92 is coupled to the circuit portion 34 and configured to receive and invert the intermediate signal 38 to obtain an inverted intermediate signal representing the clock signal 24. Further intermediate processing is also possible here. The embodiment is based on obtaining the clock signal based on the inversion of the intermediate signal 38, due to the time shift caused by the inversion. The apparatus 60 may include the control means 86 configured to terminate an operation of the inverter circuit 92 after a number of at least one measurement interval and/or comparison phases. Furthermore, the control circuit is configured to terminate an operation of at least a part of the comparator circuit 12 as described in connection with the apparatus 50. When the part of the comparator circuit is turned on again, it has a comparator circuit state comparable to a reference state obtained by means of the regeneration phase of FIG. 3a or 4a for a subsequent measurement interval. When the inverter circuit is switched on again, the clock signal 24 is generated again, in particular on the basis of the operating states of the comparator circuit 12 which have also been resumed.

With reference to the comparator circuit of FIG. 10, terminating the operation of the comparator circuit is explained by way of example. The explanations are readily transferable to other comparator circuits in connection with embodiments described herein.

In FIG. 10, for example, the following signals can be present for an output state $V_{OP}=1$; and $V_{ON}=0$; and clkn=0, where clkn describes the inverted signal clk and is represented in FIG. 10 as:

$\overline{CLK}$

Then, the supply potential VDD can be lowered to 0 V to disable the operation. Via the opened transistors Mt2 and M7, $V_{OP}$ is now connected to 0 V of VDD, thus $V_{OP}$ also changes to 0 V. The cross-coupled latch structure causes the transistor M8 to become conductive and discharge $V_{ON}$ to VDD=0 V.

Due to the coupling of the first and second stage via M11 and M12 (high active), in the case of clkn=1 and clk=0, for example, the case could occur that the outputs $V_{OP}$ and $V_{ON}$ would not reset immediately, but the above case would occur at first when one of the two signals has discharged via leakage currents to an extent such that it is interpreted by the inverters as low level. Thus, the above case can occur again and a reference state can be obtained.

Figure 9:
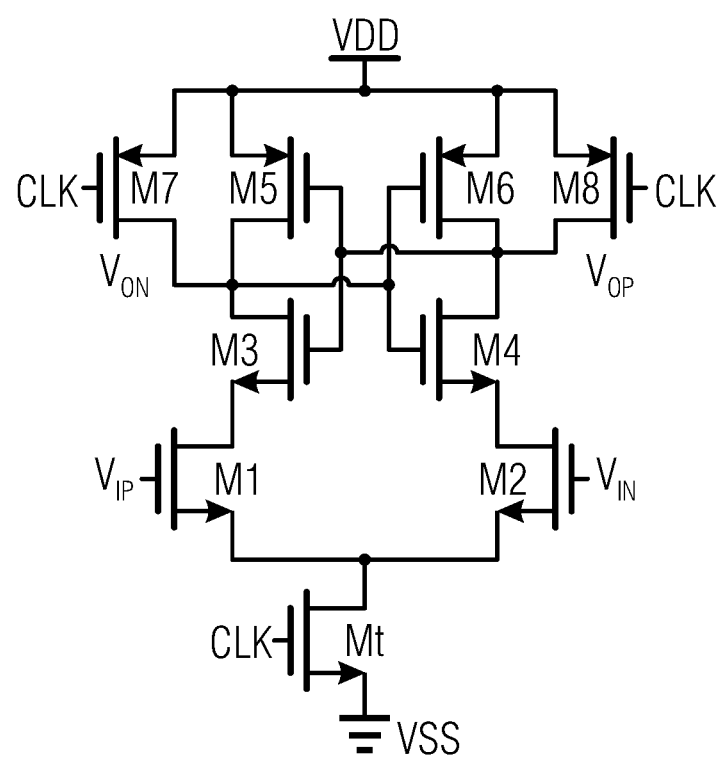
FIG. 9 shows a block circuit diagram as an example of a known discrete-time/clocked or dynamic comparator that may be used in embodiments.

If, on the other hand, the comparator from FIG. 9 is considered, an initial state can exist for: $V_{OP}=1$; $V_{ON}=0$; and clk=1. Vdd is pulled to 0 V, thus disabled. $V_{OP}$ is discharged to 0 V via the open transistor M6, thus M5 becomes conductive and $V_{ON}$ remains at 0 V. If clk should be at 0 V at any time, $V_{OP}$ and $V_{ON}$ are connected to VDD as in the normal operation mode and in this case pulled to 0V.

In embodiments, it may also be provided for to supply all functional blocks, the comparator circuit 12, the XOR gate 32 and the inverter circuit 92 with power or to remove this power supply again, i.e., to switch it off. It may be technically more practical in this case to control only the inverter via the supply. Here, the reference state can be obtained as follows, exemplarily using a CMOS inverter that can be used in FIG. 6b as the inverter 92. If the input of the inverter 92 is in=1, the NMOS is conductive and connects the output of the inverter to VSS=0V which can cause clk=0 and the comparator to be reset for the clock signal. If the input of the inverter 92 in=0, the PMOS is conductive and connects the output of the inverter to VDD=0V, which resets the comparator, thus obtaining the reference state. The clock signal remains at a 0 level, no matter what comparison result the comparator provides or can still provide.

FIG. 6b shows a schematic exemplary representation of waveforms of signals $14_1$, $14_2$, $22_1$ and $22_2$ and 24 and 38 as a function of a supply voltage 94 applied to the inverter circuit 92 for operation thereof. This time period may define the measurement interval 52, although, as in the other embodiments, additional, different and/or further measurement intervals may be provided easily.

Disabling the inverter circuit 92 may cause the clock signal 24 to stop deviating from and return to a level $24_1$ indicating the regeneration state or reference state. A renewed execution of a comparison phase is thus prevented.

The principle circuit diagram shown in FIG. 6a represents a further possible simplification of embodiment 3. The second XOR gate is replaced by a simple inverter. FIG. 6b shows the associated simulated signal waveforms. As in the previous example, the basic control of the self-oscillation is performed via the positive supply potential vdd.

Without the voltage supply vdd applied, all internal nodes are at 0V=vss=ground. When applying a sufficient supply voltage vdd at 100 ns, the inverter can now start its function and invert the signal xor1=0. Thus, the signal clk is to jump from 0 to 1 and the comparator must change to the active comparison phase.

As a result of this comparison operation, the outputs out1 and out2 have different logic levels and xor1 jumps to 1. Thus, a 1 is now present at the input of the inverter and clk jumps to 0, whereby the comparator changes to the passive regeneration phase. Thus, both outputs out1 and out2 become 0 again, xor1 also becomes 0 and the cycle starts again.

Since no control via a control signal is provided, this self-oscillation can only be interrupted by interrupting the supply voltage vdd, such as at 200 ns.

The spikes at the switch-on moment of vdd and the residual voltage offsets at the switch-off moment of vdd are due to capacitive coupling and non-ideal circuit components.

Compared to embodiment 3, the pulse widths of clk and thus also out1 and out2 are somewhat shorter, since the signal delay or propagation time in the inverter is somewhat shorter than in an XOR gate. As a result, 7 instead of only 6 comparison operations are performed in the present test case.

FIG. 6a shows a principle circuit diagram of an embodiment without an additional control signal and FIG. 6b shows simulated signal waveforms for this embodiment.

Compared to known approaches, the above described embodiments allow to provide a low-cost and low-complexity solution for a self-clocked comparator that nevertheless has a flexible clock rate.

In [3], for example, a realization of a tracking ADC with variable sampling rate is proposed, a dynamic comparator is part of the inner iDAC. The clock rate/sampling rate can be switched between 12.5 MHz and 50 MHz due to fixed inverter chains for the implementation of time delays.

In contrast, embodiments allow a stepless setting of many to all clock rates between the technically minimum and maximum switching rate of the comparator. To control the switching, in [3], two additional auxiliary comparators and a digital state machine are needed. In embodiments, it is sufficient to use two (when using a synchronous control signal) or 3 (when using an asynchronous control signal) XOR gates or an inverter.

In [4], a realization of a SAR (successive-approximation-register) ADC with a single-phase dynamic comparator is described. The clock does not need to be inverted, a first stage of the comparator resets the second stage. Embodiments provide a reset with a single comparator stage, thus eliminating the need to separate the preamplifier from the latch. According to [4], the control logic of the SAR ADC is asynchronous, a control signal CLKS is used to enable the sampling switches, and subsequent asynchronous logic and the delay chain are used to clock the dynamic comparator with the signal CLKC, its output signals are fed back again via logic gates and a delay chain, and a new clock cycle begins. A disadvantage compared to the embodiments described herein is that the resulting clock at the comparator is not variable and is fixed via the delay chains. Furthermore, according to [4], the control signal CLKS is clocked externally (500 kHz, 25% duty cycle) and is tuned to the clock CLKC (via the delay chains and the propagation delay of the logic) in such a way that the register is reset after a full pass of the SAR register (switch S1-S8).

In [5], a realization of a dynamic comparator with adaptive time sequence is described. The solution consists of a clocked sample/hold stage, a preamplifier, the actual dynamic comparator, various logic gates and flip-flops and an RC filter with a voltage amplifier. This involves a considerable amount of circuitry and complexity. Furthermore, this solution needs an external and in this case periodic clock signal CKS (as well as the inversion CKSB thereof) for the sample/hold stage and the reset of the flip-flop 1012 which in turn is needed to generate the EOC signal ("end of conversion"). In addition, the NOR gate 1020 is also dependent on CKS and is fed by a PMOS transistor which receives as a bias signal the result of an RC filter (disadvantageously has a fixed time constant) and a voltage amplifier (differential gain of VR and VP). The control loop according to [5] actually starts at the NAND gate 1011, but its inputs are periodically pulled, via the switches 1009 and 1010, to VDD via the signal CK_LAT independently of the two comparator outputs DP and DN so that the advantage of a self-adjustment of the clock is not preserved either.

The previously described embodiments according to FIGS. 3a-d on the one hand, 4a and 4b on the other hand, and further FIGS. 5a and 5b and 6a and 6b are described in such a way that a respective alternative implementation of the second circuit portion 46 is implemented. For example, the circuits of the apparatus 50 and 60 behave logically the same but are implemented differently. In principle, the circuit of FIG. 4a may include the mode of operation of the circuit of FIG. 3a. If it is also possible to deal with an asynchronous control signal according to FIG. 4a, then it is also possible to deal with a synchronous control signal. That is, the apparatus 40 can readily also be operated with a synchronous signal source. Alternatively or additionally, a reset, for example of the comparator to the regenerated state, can also be used in the apparatuses 30 and/or 40. In principle, each of the control loops described herein may be implemented independently. Notwithstanding the above, combinations thereof are readily possible. For example, regardless of the concept, a generated clock of the clock signal 24 can be used not only for one comparator, but also for multiple comparators, of the same design or at least having the same effect.

Although some aspects have been described in the context of an apparatus, it is to be understood that these aspects also represent a description of the corresponding method, so that a block or component of an apparatus is also to be understood to be a corresponding method step or a feature of a method step. In analogy, aspects described in connection with or as a method step also constitute a description of a corresponding block or detail or feature of a corresponding apparatus.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] Investigation of Comparator Topologies and their Usage in a Technology Independent Flash-ADC Testbed

[2] An energy-efficient high-speed CMOS hybrid comparator with reduced delay time in 40-nm CMOS process
[3] A Tracking ADC with Transient-Driven Self-Clocking for Digital DC-DC Converters
[4] An energy-efficient SAR ADC using a single-phase clocked dynamic comparator with energy and speed enhanced technique
[5] CN110391796A DYNAMIC COMPARATOR WITH ADAPTIVE TIMING SEQUENCE

The invention claimed is:

1. An apparatus comprising:
a comparator circuit configured to compare a first input signal with a second input signal during a first comparison phase to acquire a comparison result; and to output an output signal, a waveform of the output signal being indicative of the comparison result; and to reset, during a subsequent regeneration phase, at least a portion of the comparator circuit for a subsequent second comparison phase; wherein the comparator circuit is configured to receive a clock signal and to change from the first comparison phase to the regeneration phase based on the clock signal; and
a clock generation circuit configured to receive the output signal or a signal derived therefrom and to generate the clock signal based on the waveform of the output signal; to control the comparator circuit from the comparison phase to the regeneration phase depending on the waveform;
wherein the clock generation circuit comprises a first circuit portion configured to output at a first circuit portion output a first intermediate signal indicating whether or not a comparison result is present; wherein the apparatus comprises a second circuit portion configured to derive the clock signal from the first intermediate signal; and at least one of:
wherein the comparator circuit is configured to provide the output signal as a first partial signal and a second partial signal; and is configured to indicate the comparison result starting from a reference state acquired by a preceding regeneration phase by means of a level change in exclusively one of the first partial signal and the second partial signal; wherein the first circuit portion is formed as a first XOR gate and the first partial signal and the second partial signal are coupled to inputs of the first XOR gate;
wherein the second circuit portion comprises: a signal source configured to provide a control signal comprising a first control signal level for the duration of a measurement interval for performing at least the first comparison phase; a second XOR gate connected on the input side to the signal source and to the first circuit portion output; and configured to provide the clock signal based on a combination of the control signal and the first intermediate signal;
wherein the second circuit portion comprises: a third XOR gate;
wherein an output of the third XOR gate is coupled to a first input of the second XOR gate; and a second input of the second XOR gate is coupled to the first circuit portion output to receive the first intermediate signal; wherein the third XOR gate is configured to provide a second intermediate signal at a signal output; wherein the second XOR gate is configured to provide, based on a combination of the first intermediate signal and the second intermediate signal, the clock signal at an output of the second XOR gate coupled to the comparator circuit on the one hand and to the first input of the third XOR gate on the other hand;
wherein the second circuit portion comprises: a continuous signal source configured to provide a constant control signal; a controller configured to supply the continuous signal source and the comparator circuit with a power for operating the continuous signal source and the comparator circuit for the duration of a measurement interval for performing at least the first comparison phase; the second XOR gate coupled on the input side to the continuous signal source and to the first circuit portion output; and configured to provide the clock signal based on a combination of the constant control signal and the first intermediate signal; and
wherein the second circuit portion comprises: an inverter circuit coupled to the first circuit portion and configured to invert the first intermediate signal to acquire an inverted intermediate signal; and to acquire the clock signal based on the inverted intermediate signal; wherein the apparatus further comprises a controller configured to terminate operation of the inverter circuit after a number of at least one measurement interval of the apparatus; and when the inverter circuit is switched on again, to acquire a state of the comparator circuit comparable to a reference state acquired by means of the regeneration phase for a subsequent measurement interval; and to generate the clock signal again when the inverter circuit is switched on again.

2. The apparatus according to claim 1, wherein the comparator circuit is configured to provide the output signal as a first partial signal and a second partial signal; and is configured to indicate the comparison result starting from a reference state acquired by a preceding regeneration phase by means of a level change in exclusively one of the first partial signal and the second partial signal.

3. The apparatus according to claim 1, configured to generate the clock signal automatically and in dependence on the first input signal and the second input signal.

4. The apparatus according to claim 1, wherein the clock generation circuit is configured to generate, triggered by a level change of the output signal indicating that the comparison phase is completed and the comparison result is present, a level change in the clock signal triggering a change from the first comparison phase to the regeneration phase.

5. The apparatus according to claim 1, wherein completion of the regeneration phase causes a level change in the clock signal which triggers the second comparison phase.

6. The apparatus according to claim 1, wherein the clock generation circuit is configured to generate, triggered by a level change in the output signal indicating that the comparison phase is completed and the comparison result is present, a first level change in the clock signal which triggers a change from the first comparison phase to the regeneration phase; and wherein completion of the regeneration phase causes a second level change in the clock signal which triggers the second comparison phase.

7. The apparatus according to claim 1, wherein a time duration of the comparison phase is dependent on the first input signal and the second input signal; the apparatus being configured to generate a clock rate of the clock signal in dependence on the time duration of the comparison phase.

8. The apparatus according to claim 1, wherein the signal source is configured to provide, during the measurement interval, the control signal with a first signal level logically corresponding to a result signal level of the first intermediate signal indicating that the comparison result is present; wherein a regeneration level of the first intermediate signal indicates that the regeneration phase is performed and is different from the result signal level;

wherein the signal source is synchronized with the first circuit portion and is implemented to change the control signal to a second control signal level, the logic state of which corresponds to the regeneration level, for terminating the measurement interval; wherein the signal source is configured to change the control signal to the second control signal level for terminating the measurement interval exclusively at times when the first intermediate signal comprises the regeneration level.

9. The apparatus according to claim 1, wherein the signal source is configured to provide, during the measurement interval, the control signal with a first signal level logically corresponding to a result signal level of the first intermediate signal indicating that the comparison result is present; wherein a regeneration level of the first intermediate signal indicates that the regeneration phase is performed and is different from the result signal level;

wherein the signal source is configured to initiate termination of the measurement interval by changing the control signal to a second control signal level;

wherein the apparatus is configured to change the second intermediate signal, by coupling to the output of the second XOR gate by means of the third XOR gate, upon a change of the control signal to the second control signal level, to a state logically corresponding to the regeneration level exclusively at times when the first intermediate signal comprises the regeneration level.

10. The apparatus according to claim 1, configured to terminate the measurement interval exclusively at a time when the first intermediate signal comprises a regeneration level indicating that the comparator circuit is regenerated for a subsequent comparison phase.

11. The apparatus according to claim 1, wherein the controller is configured to, at an end of the measurement interval, switch off the continuous signal source; and switch off at least a part of the comparator circuit in order to acquire a state comparable to a reference state acquired by means of the regeneration phase when the comparator circuit is switched on again for a subsequent measurement interval.

* * * * *